United States Patent
Polley et al.

(10) Patent No.: US 10,197,638 B2
(45) Date of Patent: Feb. 5, 2019

(54) HIGH BANDWIDTH HALL SENSOR

(71) Applicant: Texas Instruments Incorporated, Dallas, TX (US)

(72) Inventors: Arup Polley, Richardson, TX (US); Srinath Ramaswamy, Murphy, TX (US); Baher S. Haroun, Allen, TX (US); Rajarshi Mukhopadhyay, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 204 days.

(21) Appl. No.: 15/186,383

(22) Filed: Jun. 17, 2016

(65) Prior Publication Data
US 2017/0363693 A1    Dec. 21, 2017

(51) Int. Cl.
*H03F 7/06* (2006.01)
*G01R 33/00* (2006.01)
*G01R 33/07* (2006.01)
*H03F 3/38* (2006.01)
*H03F 3/45* (2006.01)

(52) U.S. Cl.
CPC ....... *G01R 33/0029* (2013.01); *G01R 33/075* (2013.01); *H03F 3/38* (2013.01); *H03F 3/45995* (2013.01)

(58) Field of Classification Search
CPC ........... H03F 15/00; H03F 3/45475; H03F 2200/261; H03F 3/217; H03F 2200/03; H03F 3/2173; H03F 3/68; H03F 2203/45138; H03F 2203/45528; H03F 3/2171
USPC .............. 330/6, 9, 174, 69; 327/307, 308; 324/117 H
See application file for complete search history.

(56) References Cited

U.S. PATENT DOCUMENTS 4,484,146 A  *  11/1984  Naito  ............... H03H 11/126
                                             330/107

* cited by examiner

*Primary Examiner* — Khanh V Nguyen
*Assistant Examiner* — Khiem Nguyen
(74) *Attorney, Agent, or Firm* — Michael A. Davis, Jr.; Charles A. Brill; Frank D. Cimino

(57) ABSTRACT

A high bandwidth Hall sensor includes a high bandwidth path and a low bandwidth path. The relatively high offset (from sensor offset) of the high bandwidth path is estimated using a relatively low offset generated by the low bandwidth path. The relatively high offset of the high bandwidth path is substantially reduced by combining the output of the high bandwidth path with the output of the low bandwidth path to generate a high bandwidth, low offset output. The offset can be further reduced by including transimpedance amplifiers in the high bandwidth sensors to optimize the frequency response of high bandwidth Hall sensor.

19 Claims, 15 Drawing Sheets

HIGH BANDWIDTH HALL SENSOR

BACKGROUND

Many applications of integrated circuits require acquisition of sensor information derived from sensing events related to physical objects or phenomena that are external to the integrated circuits of the applications. The sensor information relating to events being sensed may include sensor quantities such as positioning (including positioning and orientation of a physical object) and detection (including measurement of, e.g., a current pulse). Often, such applications require relatively accurate sensor information of events such physical objects and phenomenon that changes relatively quickly with respect to one or more reference values. However, when a physical object moves (and/or the detected phenomenon changes) relatively quickly, the ability of various sensors to accurately to detect and provide (e.g., relatively) instantaneous sensor information typically decreases. Likewise, providing accurate sensor information at increased resolution typically decreases, for example, the rates at which sensor quantities can be determined from the provided sensor information.

SUMMARY

The problems noted above can be addressed in a high bandwidth Hall sensor that includes a high bandwidth path and a low bandwidth path. The relatively high offset (from sensor offset) of the high bandwidth path is estimated using a relatively low offset generated by the low bandwidth path. The relatively high offset of the high bandwidth path is substantially reduced by combining the output of the high bandwidth path with the output of the low bandwidth path to generate a high bandwidth, low offset output. The bandwidth can be further increased by including transimpedance amplifiers in the high bandwidth sensors to optimize the frequency response of high bandwidth Hall sensor.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "input" can mean either a source or a drain (or even a control input such as a gate where context indicates) of a PMOS (positive-type metal oxide semiconductor) or NMOS (negative-type metal oxide semiconductor) transistor. The term "mode" can mean a particular architecture, configuration (including electronically configured configurations), arrangement, application, and the like, for accomplishing a purpose. The term "processor" can mean a circuit for processing, a state machine and the like for execution of programmed instructions for transforming the processor into a special-purpose machine, circuit resources used for the processing, and combinations thereof. The term "sensor" can mean one or more sensors provide one or more signals for conveying positioning information, including circuitry for driving the sensor and extracting positioning information from a signal provided by the sensor. Where multiple sensors mutually function as (for example) an enhanced unified sensor, each of the multiple sensors can be referred to as an "element."

Figure 1:
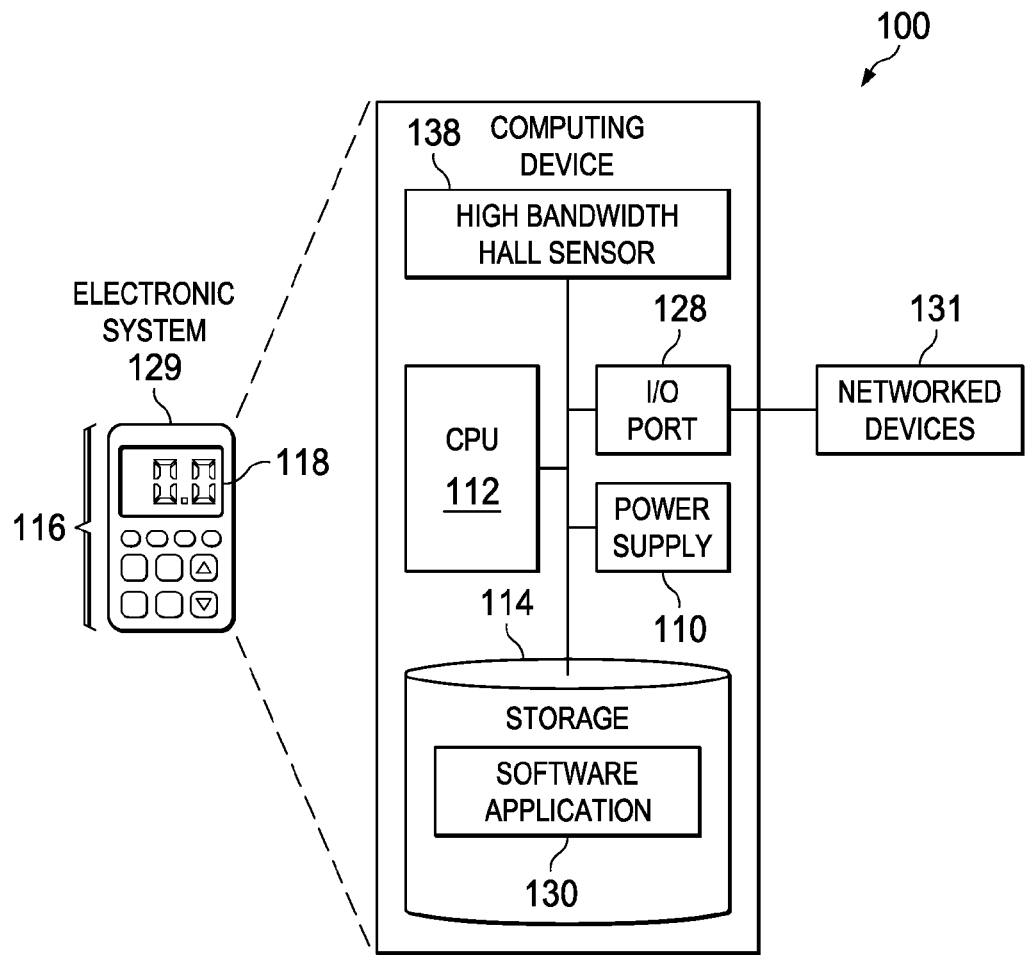
FIG. 1 shows an illustrative computing system 100 in accordance with certain embodiments of the disclosure.

FIG. 1 shows an illustrative computing system 100 in accordance with certain embodiments of the disclosure. For example, the computing system 100 is, or is incorporated into, an electronic system 129, such as a computer, electronics control "box" or display, communications equipment (including transmitters), or any other type of electronic system arranged to generate electrical signals.

In some embodiments, the computing system 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores instructions for one or more software applications 130 (e.g., embedded applications) that, when executed by the CPU 112, perform any suitable function associated with the computing system 100.

The CPU 112 comprises memory and logic circuits that store information frequently accessed from the storage 114. The computing system 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors (including sensors), gyros, accelerometers, and the like. The CPU 112 is coupled to I/O (Input-Output) port 128, which provides an interface for receiving input from (and/or provide output to) networked devices 131. The networked devices 131 can include any device capable of point-to-point and/or networked communications with the computing system 100. The computing system 100 can also be coupled to peripherals and/or computing devices, including tangible, non-transitory media (such as flash memory) and/or cabled or wireless media. These and other input and output devices are selectively coupled to the computing system 100 by external devices using wireless or cabled connections. The storage 114 can be accessed by, for example, by the networked devices 131.

The CPU 112 is coupled to I/O (Input-Output) port 128, which provides an interface for receiving input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, charged capacitor, and the like).

The computing system 100 includes a high bandwidth Hall sensor 138 for providing accurate positioning information at high bandwidths (e.g., high speeds). As discussed below, the high bandwidth Hall sensor 138 typically includes multiple sensors mutually arranged as an enhanced Hall-effect sensor. The high bandwidth Hall sensor architectures disclosed herein are capable of providing accurate position information using bandwidths that, for example, are greater than around 200 MHz (see FIG. 15, for example).

The bandwidth of a system that includes Hall sensors is indirectly limited by offset cancellation techniques for reducing the offset(s) of the Hall sensor(s). The offset of a Hall sensor is the voltage output (e.g., Hall output signal) of the Hall sensor when no magnetic field B (where "B" is the Systéme International d'Unités magnetic induction symbol expressed in units of Tesla) is present (e.g., when the magnetic field B has a value of 0 T). The voltage offset of a Hall element is an inherent quality (e.g., having a voltage otherwise associated with a magnetic field strength of around an order of magnitude around 100 mT) and, for a single Hall element, is normally sufficiently large to obscure the change in the voltage of a Hall element output signal that occurs in response to a typically applied magnetic field.

When orthogonal coupling (where OC is a first conventional offset reduction technique) is applied to multiple Hall elements (by arranging the multiple Hall elements in an orthogonally coupled configuration), the offset of the multiple Hall elements is typically reduced to a residual offset having a voltage otherwise associated with a magnetic field of around (e.g., an order of magnitude of) 10 mT. When spinning current techniques (where SCT is a second conventional offset reduction technique) are applied to the orthogonally coupled Hall sensor, the further-reduced offset is further reduced to a residual offset indicative of a magnetic field of around 10 through 100 µT (microtesla) with bandwidth limited to a (e.g., reduced) maximum frequency of around 100 through 200 kHz (kilohertz).

Accordingly, Hall sensors typically have a relatively large offset, where the uncompensated offset of a Hall sensor typically greatly exceeds the magnitude of a typical signal output by the Hall sensor. For example, an uncompensated offset in a Hall output signal of a typical Hall sensor is a voltage that would indicate the presence of a magnetic field of around 10 through 50 mT (millitesla). In contrast, the Hall signal output by the typical Hall sensor is capable of indicating (e.g., changes in) quantities from around 1 µT (microtesla) through 10 mT (millitesla).

The offset of Hall sensors can be reduced using the above-mentioned offset compensation techniques. The offset compensation techniques include techniques such as orthogonal coupling (OC) and spinning current techniques (SCT). Conventional offset compensation techniques are discussed below with reference to (at least) FIG. 2, FIG. 3, and FIG. 4.

Figure 2:
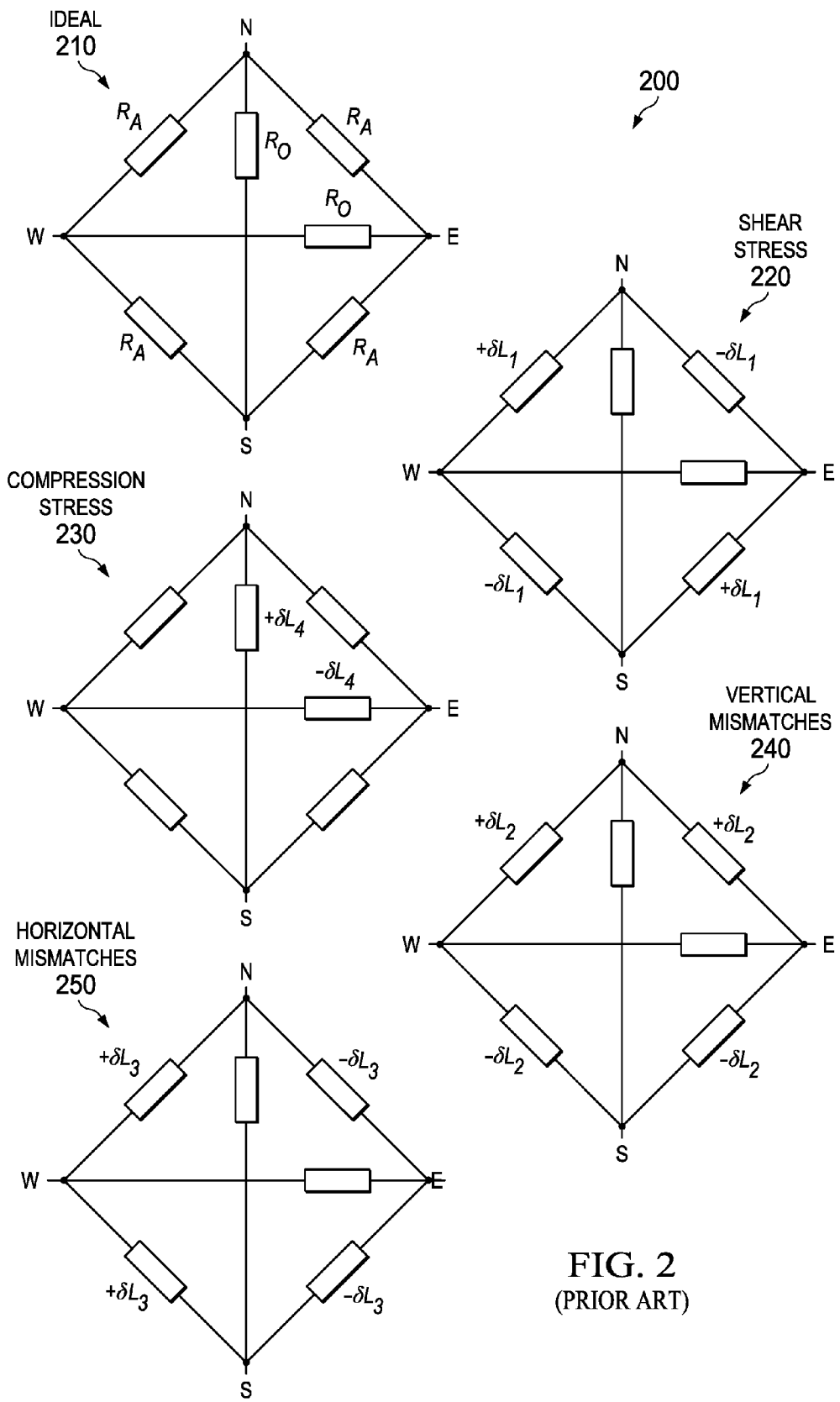
FIG. 2 is a schematic of a six-resistor bridge illustrating various causes of offset in Hall elements.

FIG. 2 is a schematic of a six-resistor bridge illustrating various causes of offset in Hall elements. Bridge 210 is an idealized bridge illustrating effective resistances between (e.g., contacts of) terminal pairs (e.g., combinations of two terminals) of the four terminals of a Hall element of a Hall sensor. For example, the resistance $R_A$ illustrates the effective resistance between adjacent pairs (NW, NE, SW, and SE) of the terminals N, S, E, and W (north, south, east, and west), whereas the resistance $R_O$ illustrates the effective resistance between opposing pairs (NS and EW) of the four terminals. (Accordingly, the terminology corresponds, for example, with relative locations of physical terminals arranged in a semiconductor substrate.) The effective resistance between a pair of terminals is, for example, the impedance developed by a conduction channel established between each terminal pair.

However, differences exist between the resistances between the various terminal pairs of real-world Hall-effect sensors (where such differences are sources of offset). The differences can result from, for example, shear stress, vertical mismatches, horizontal mismatches, and compression stress. Each of the four causes can result in a (e.g., nonlinear) change in the effective resistance, where the change in the effective resistance caused by each such cause is respectively referred to as terms $\delta R_1$, $\delta R_2$, $\delta R_3$, and $\delta R_4$. Accordingly, the effective resistance of each terminal pair can be expressed as:

$$R_{NW} = R_A + \delta R_1 + \delta R_2 + \delta R_3$$

$$R_{NE} = R_A - \delta R_1 + \delta R_2 - \delta R_3$$

$$R_{SW} = R_A - \delta R_1 - \delta R_2 + \delta R_3$$

$$R_{SE} = R_A + \delta R_1 - \delta R_2 - \delta R_3$$

$$R_{Ns} = R_O + \delta R_4$$

$$R_{EW} = R_O - \delta R_4 \quad (1)$$

The terms $\delta R_1$, $\delta R_2$, $\delta R_3$, and $\delta R_4$ are integrated as an integration function of the length of the conduction channels to simplify modeling (e.g., of causes of offset in a Hall-effect bridge, or "cross"), where each such integration respectively produces a value for the terms $\delta L_1$, $\delta L_2$, $\delta L_3$, and $\delta L_4$. The effects ($\delta R_1$) of shear stress on the ideal bridge 210 is illustrated by bridge 220. The effects ($\delta R_2$) of vertical mismatches (e.g., of mismatches resulting from misalignments and doping gradients in the N-well of a Hall-effect sensor cross) on the ideal bridge 210 is illustrated by bridge 240. The effect ($\delta R_3$) of horizontal mismatches (e.g., of mismatches also resulting from misalignments and doping gradients in the N-well of a Hall-effect sensor cross) on the ideal bridge 210 is illustrated by bridge 250. The effect ($\delta R_4$) of compression on the ideal bridge 210 is illustrated by bridge 230. Accordingly, $\delta R_2$ and $\delta R_3$ are used to model offsets caused by asymmetries in a manufactured Hall-effect cross, and $\delta R_4$ is used to model an impedance anisotropy of the bridge induced by a compression stress.

Figure 3:
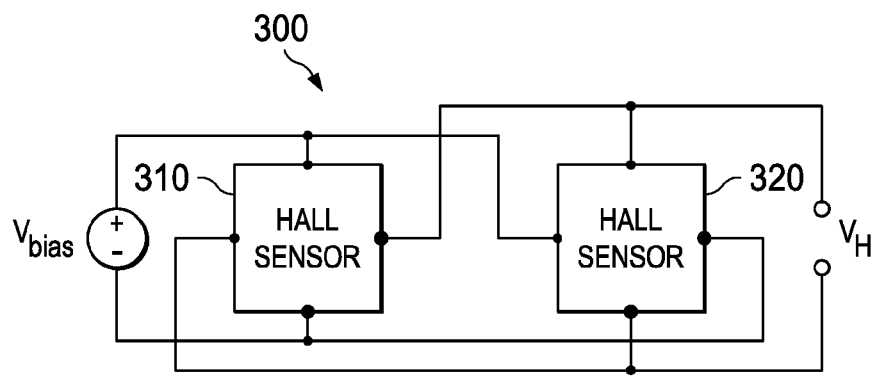
FIG. 3 is a schematic illustrating offset compensation through orthogonally coupled Hall elements of Hall sensors.

FIG. 3 is a schematic illustrating offset compensation through orthogonally coupled Hall elements of Hall sensors. The Hall sensor circuit 200 includes orthogonally coupled elements such a Hall sensor 310 and Hall sensor 320. Hall sensor 310 and Hall sensor 320 are selected (and/or designed) such that the "plate" (e.g., electrically active portion) of a first Hall sensor has characteristics similar to a second (and optionally, third and fourth) Hall sensor. Substantially similar plates of Hall-effect sensors have, for example, offsets that are substantially and mutually offset by operation of orthogonal coupling of a magnetic field (e.g., such that direct current gains of each sensor are substantially equal). In the ideal case where the offsets each plate are equal, the offsets (e.g., theoretically) are cancelled in (e.g., ideally) orthogonally coupled plates.

Hall sensor 310 and Hall sensor 320 are orthogonally coupled such that "orthogonal" terminals are respectively coupled. For example, the north terminal of Hall sensor 310 and the west terminal of Hall sensor 320 are connected, the east terminal of Hall sensor 310 and the north terminal of Hall sensor 320 are connected, the south terminal of Hall sensor 310 and the east terminal of Hall sensor 320 are connected, and the west terminal of Hall sensor 310 and the south terminal of Hall sensor 320 are connected.

In operation, a voltage source ($V_{BIAS}$) includes a positive terminal for applying a bias voltage to the north terminal of Hall sensor 310 and the west terminal of Hall sensor 320. The voltage source includes a negative terminal for receiving a bias current from the south terminal of Hall sensor 310 and the east terminal of Hall sensor 320 (e.g., such the bias current is generated in response to the applied bias voltage $V_{BIAS}$). In response to the applied bias voltage and an applied magnetic field, Hall sensor 310 and Hall sensor 320 each generate a Hall-effect voltage in response to respective orthogonal portions of the magnetic field. Accordingly, a combined Hall-effect output voltage ($V_H$) is generated having a reduced offset with respect to an individual offset of a single Hall sensor.

Figure 4:
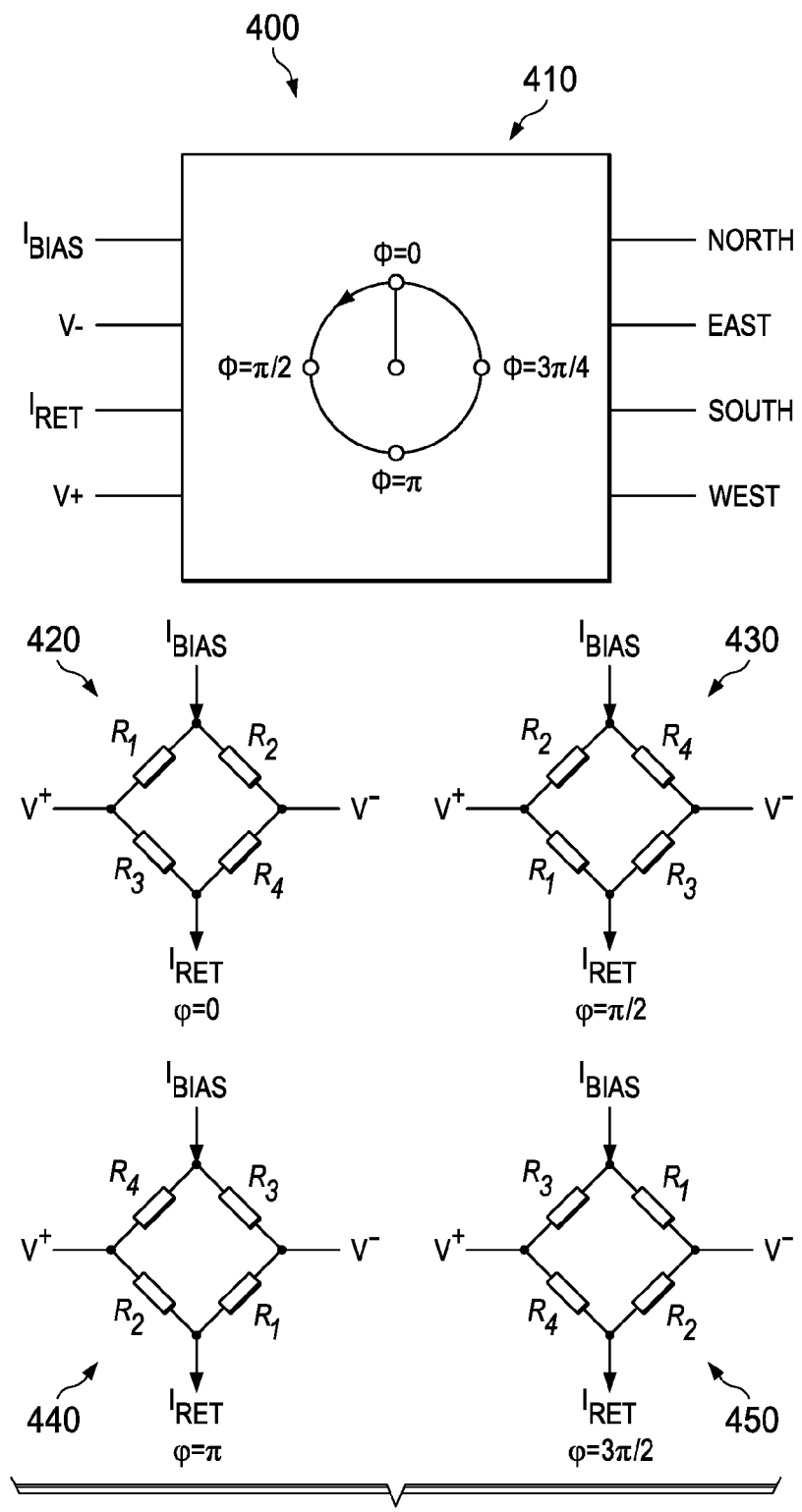
FIG. 4 is a schematic illustrating offset compensation through application of current spinning techniques to Hall elements of Hall sensors.

FIG. 4 is a schematic illustrating offset compensation through application of current spinning techniques to Hall elements of Hall sensors. The Hall sensor circuit 400 includes switch 410. The switch 410 is controlled by control logic such as CPU 112. The switch 410 is, for example, a (e.g., virtual) rotary switching matrix having four inputs, four poles, and four outputs. The switch 410 simultaneously cycles each of four inputs to a respective physical terminal of a Hall cross in accordance with a switching phase of the poles. For example, at phase $\varphi=0$ (e.g., radians), $I_{BIAS}$ is coupled to a north-positioned terminal, V− is coupled to an east-positioned terminal, $I_{RET}$ is coupled to a south-positioned terminal, and V+ is coupled to a west-positioned terminal. When the phase is at $\varphi=\pi/2$, $I_{BIAS}$ is coupled to a east-positioned terminal, V− is coupled to an south-positioned terminal, $I_{RET}$ is coupled to a west-positioned terminal, and V+ is coupled to a north-positioned terminal. When the phase is at $\varphi=\pi$, $I_{BIAS}$ is coupled to a south-positioned terminal, V− is coupled to an west-positioned terminal, $I_{RET}$ is coupled to a north-positioned terminal, and V+ is coupled to an east-positioned terminal. When the phase is at $\varphi=3\pi/2$, $I_{BIAS}$ is coupled to a west-positioned terminal, V− is coupled to an north-positioned terminal, $I_{RET}$ is coupled to an east-positioned terminal, and V+ is coupled to a south-positioned terminal.

The cycling of each of four inputs to a respective physical terminal of a Hall cross in accordance with a switching phase is illustrated using bridges 420, 430, 440, and 450. Bridge 420 illustrates the coupling of the input signals to a physical bridge at phase $\varphi=0$. Bridge 430 illustrates the coupling of the input signals to a physical bridge at phase $\varphi=\pi/2$. Bridge 440 illustrates the coupling of the input signals to a physical bridge at phase $\varphi=\pi$. Bridge 450 illustrates the coupling of the input signals to a physical bridge at phase $\varphi=3\pi/2$.

The offset voltages of bridges 420, 430, 440, and 450 are given respectively as:

$$V_{offset}(\varphi = 0) = I_{BIAS} \cdot \frac{R_2 R_3 - R_1 R_4}{R_1 + R_2 + R_3 + R_4} \quad (2)$$

$$V_{offset}\left(\varphi = \frac{\pi}{2}\right) = I_{BIAS} \cdot \frac{R_1 R_4 - R_2 R_3}{R_1 + R_2 + R_3 + R_4} = -V_{offset}(\varphi = 0)$$

$$V_{offset}(\varphi = \pi) = I_{BIAS} \cdot \frac{R_2 R_3 - R_1 R_4}{R_1 + R_2 + R_3 + R_4} = V_{offset}(\varphi = 0)$$

-continued $$V_{offset}\left(\varphi = \frac{3\pi}{2}\right) = I_{BIAS} \cdot \frac{R_1 R_4 - R_2 R_3}{R_1 + R_2 + R_3 + R_4} = -V_{offset}(\varphi = 0)$$

Theoretically, orthogonal switching eliminates offsets by combining outputs having a phase difference of (e.g., plus or minus) π/2 radians. However, manufacturing limitations usually results in asymmetries in bridges such that the voltage offset is not eliminated simply by combining outputs of phases that differ by π/2 radians.

The voltage offset can be further reduced by using current spinning techniques. For example, current spinning techniques are used in determining a residual voltage offset by calculating an average voltage using voltage outputs of mutually orthogonal phases. (Although four outputs are shown in the example, other bridges having a number of outputs that are higher powers of two can be used: see, for example, FIG. 7 below, which illustrates a bridge having eight outputs.)

However, the use of current spinning techniques substantially limit the bandwidth of a signal for providing the residual voltage. The bandwidth is limited by factors such as the time required for bias current settling after the poles of the switch is advanced in each phase, the clock speed of sample and hold times required for sampling bridge outputs, and the time used to determine a compensated output (e.g., which includes a residual offset) after a radians of phase switching. The time used to determine a compensated output can be, for example, the time used to accumulate four samples and calculate the average value of the samples. (Each determined output can be output as a value after the conclusion of complete cycle—e.g., 2π radians—of phase switching such that a compensated output signal is generated.)

Figure 5:
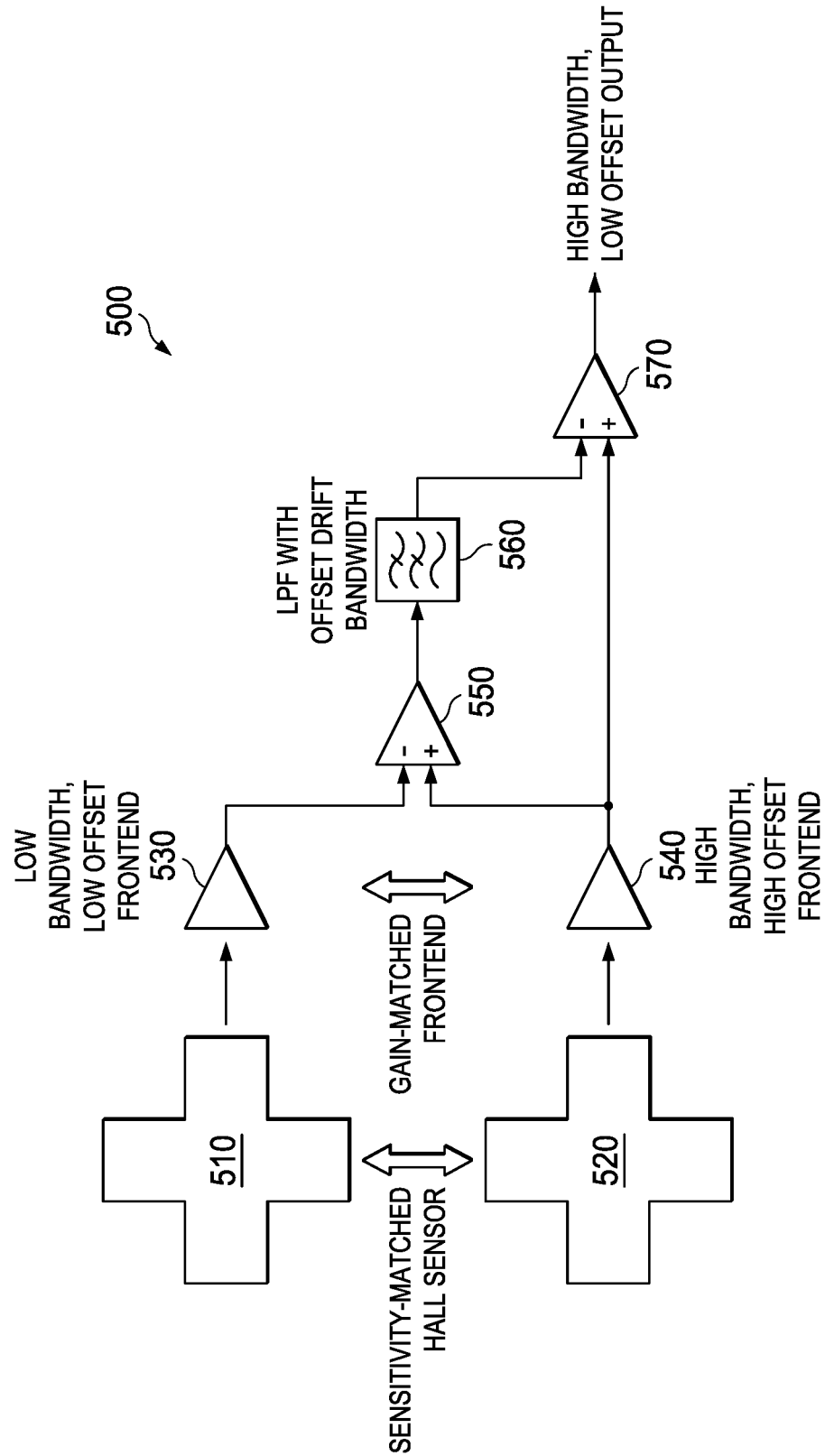
FIG. 5 is a schematic of high bandwidth Hall-effect circuit 500 in accordance with embodiments of the disclosure.

FIG. 5 is a schematic of high bandwidth Hall-effect circuit 500 in accordance with embodiments of the disclosure. The high bandwidth Hall-effect circuit 500 includes sensors 510 and 520, amplifiers 530 and 540, differential amplifier 550, filter 560, and differential amplifier 570. The high bandwidth Hall-effect circuit 500 is arranged having a low bandwidth path (which includes components 510, 530, 550, and 560) and a high bandwidth path (which includes components 520 and 540). As disclosed herein, the relatively high offset of the high bandwidth path is substantially determined (e.g., estimated) in response to a relatively low offset generated by the low bandwidth path. The relatively high offset of the high bandwidth path is substantially reduced by combining the output of the high bandwidth path with the output of the low bandwidth path to generate a high bandwidth, low offset output. The low bandwidth path typically includes signals having a maximum frequency of $f_1$, whereas the high bandwidth path typically includes signals having a maximum frequency of $f_2$ (e.g., where $f_1 \ll f_2$).

Sensor 510 is a sensor, which includes a set of (e.g., two or more) Hall elements. A Hall element can be a square (e.g., see 310), a cross (e.g., a Van der Paw structure such as 710), an octagon (e.g., see 730) or any other suitable shape. Typically, the geometry of each Hall element is ideally identical to other Hall elements used in a sensor 510. The set of Hall elements for sensor 510 is arranged to generate a first Hall sensor output signal such that such that the signal includes a first offset ($Off_1$) that is lower than a second offset ($Off_2$, discussed below, of a second Hall sensor signal). For example, the Hall elements of sensor 510 are orthogonally coupled and spinning current techniques applied such that a low offset signal is generated. As discussed above, lowering the offset normally results in a lower bandwidth of the Hall sensor output signal. The (e.g., relatively robust OC and SCT) offset reduction techniques used to reduce the voltage offset of the sensor 510 to a voltage indicative of a 1 µT field correspondingly reduce the maximum bandwidth of the Hall sensor output signal to around (e.g., only) 5 kHz. Accordingly, the first Hall sensor output signal is associated with a low-bandwidth path and a (e.g., reduced) residual offset such that, for example, the sensor 510 generates a Hall sensor output signal having an enhanced sensitivity to effects on the sensor 510 by a change in a magnetic field.

A nominally equal bias current IBIAS (described above with respect to FIG. 4) is typically applied to each element of sensor 510 such that the resulting sensitivities are substantially equal. As discussed further below, sensor 510 has a sensitivity $S_1$ (e.g., in Volts per Tesla) to an applied magnetic field $B_{in}$, wherein the sensitivity can be controlled during manufacture, for example, by adjusting the dopant level of the regions of the conductive channels of the Hall elements for sensor 510. The dopant levels of the regions of the conductive channels of the Hall elements for sensor 510 are typically applied equally such that the sensitivities/impedances of each of the various conductive channels are substantially equal.

Amplifier 530 is an analog front-end amplifier. The (one or more terminals of the) input of amplifier 530 is coupled to the (one or more terminals of the) output of sensor 510 such that amplifier 530 has a gain $G_1$. The amplifier 530 amplifies the first Hall sensor output signal (received from the sensor 510) to generate an output signal ($Out_1$). Accordingly, the output signal $Out_1$ can be characterized in accordance with $Out_1 = G_1 S_1 B_{in}(0-f_1) + Off_1$, where the range "$0-f_1$" indicates that the term $Out_1$ corresponds roughly to a frequency band $B_{in}$ spanning 0 Hertz to $f_1$ Hertz of the input magnetic field.

Sensor 520 is a sensor, which includes a set of (e.g., one or more) Hall elements. The set of Hall elements for sensor 520 is arranged to generate a second Hall sensor output signal such that the second Hall sensor output signal (e.g., as compared with the first Hall output signal generated by sensor 510) includes an offset ($Off_2$) that is higher than the offset ($Off_1$) of the first Hall sensor output signal (output by sensor 510). Accordingly, the bandwidth of the second Hall sensor output signal is higher than the bandwidth of the first Hall output signal.

For example, because spinning current techniques (SCT) reduce the bandwidth of a Hall sensor output signal, spinning current techniques are not necessarily applied to the Hall elements of sensor 520. Not applying SCT to the Hall sensor output signal helps ensure the generated Hall sensor output signal is a high bandwidth output signal (albeit having a substantially higher offset, where $Off_1 \ll Off_2$). (Optionally, multiple Hall elements are orthogonally coupled such that the sensor 520 has a reduced residual offset.) A nominally equal bias current IBIAS is typically applied to each element such that the resulting sensitivity of each element is substantially equal. The sensor 520 has a sensitivity $S_2$ to the applied magnetic field $B_{in}$, wherein the sensitivity is controlled during design and manufacture, for example, such that the sensitivity $S_1$ for sensor 510 is substantially equal to the sensitivity for $S_2$ sensor 520. Sensor 510 and sensor 520 are typically formed having similar design features (and the IBIAS current applied) such that the Hall-effect sensitivity of each of the sensors to a common external event is substantially similar (e.g., equal, proportional, and/or a having a mathematical relationship such that the response of one of the sensors 510 and 520 can be accurately derived from the other of the sensors 510 and 520). Accordingly, the "innate" (e.g., as formed in a substrate and assuming common inputs and exposure to the same magnetic field) response of the sensors 510 and 520 is such that the sensors 510 and 520 generate similar waveforms in response to a common (e.g., the same, external to the substrate in which the sensors 510 and 520 lie) event (e.g., a change in a magnetic field applied to both sensors 510 and 520). Accordingly, both sensor paths typically have same sensitivity and gain such that each path produces the same change in DC output when a DC magnetic field is applied (however, the waveform responses of the two sensor paths could be different because the bandwidth of each of the two sensor paths is different).

Amplifier 540 is an analog front-end amplifier. The input of amplifier 540 is coupled to the output of sensor 520 such that amplifier 540 has a gain $G_2$. The gain $G_2$ of the amplifier 540 is selected such that the gain $G_2$ is substantially equal to the gain $G_1$ of amplifier 520. The amplifier 540 amplifies the second Hall sensor output signal received from the sensor 520 to generate an output signal ($Out_2$). Accordingly, the output signal $Out_2$ can be characterized in accordance with $Out_2 = G_1 S_1 B_{in}(0-f_2) + Off_2$, where $f_2$ is the upper limit of the bandwidth $B_{in}$, and where $f_2 > f_1$ (such that $Out_2$ is the high bandwidth path).

Amplifier 550 generates a high-frequency portion output signal (Out) in response to the output signal $Out_1$ being coupled to an inverting input of amplifier 550 and in response to the output signal $Out_2$ being coupled to a noninverting input of amplifier 550. For example, amplifier 550 is a differential amplifier for generating a difference signal (e.g., in response to subtracting $Out_1$ from $Out_2$). Assuming G1=G2=G and S1=S2=S, the output signal Out can be characterized in accordance with $Out = -GSB_{in}(f_1 - f_2) + Off_2 - Off_1$. Further, the output signal (Out) primarily includes the high frequency portion (from $f_1$ to $f_2$) of the input magnetic field. In a subsequent processing step in which the high frequency content of the output signal (Out) is low-pass filtered, the filtered output becomes independent of the input magnetic field, for example, such that the filtered output (e.g., "offset correction signal") is now largely a function of the residual offset).

Filter 560 generates an offset correction signal (Off) in response to the output signal Out received from amplifier 550. For example, the filter 560 is a low pass filter (LPF) for low pass filtering the signal Out (from amplifier 550) such that the signal Off can be characterized in accordance with $Off = Off_2 - Off_1$. Because the offset $Off_1$ is measured more accurately than the measurement of the offset $Off_2$ (e.g., when using SCT and OC techniques), the signal Off is used (for example) to generate an accurate estimation of the offset $Off_2$. As described below, the less accurate offset $Off_2$ is effectively replaced by the more accurate offset $Off_1$ by combining the offset correction signal Off with the signal $Out_2$ such that the bandwidth of signal $Out_2$ substantially remains the same (e.g., is not substantially reduced).

In an embodiment, the filter 560 is a low pass filter characterized by an offset drift bandwidth. The offset estimate Off may drift over time depending on temperature, packaging stress and other ambient conditions. Accordingly, the offset bandwidth is typically selected to be sufficiently wide such that the offset bandwidth is sufficient to accurately respond to changes in offset. Typically offset bandwidth is much smaller compared to signal bandwidth. However, allowing more offset bandwidth tends to enhance low frequency noise in the signal path.

The offset correction signal Off (e.g., which contains the offsets $Off_2$ and $Off_1$) is subject to offset changes (e.g., changes due to changing operating conditions), which are sensed (e.g., tracked) at a rate up to and including the cutoff frequency (e.g., specified using a 3 dB cutoff point) of the filter 560 ($f_{lpf}$). The cutoff frequency $f_{lpf}$ is usually selected to be substantially (e.g., much) lower than frequency $f_1$ (e.g., the maximum frequency of the low bandwidth path) to avoid errors that might occur when cutoff frequency $f_{lpf}$ is higher than (e.g., around) the frequency $f_1$.

Amplifier 570 generates a combined output signal ($Out_{final}$) in response to the offset correction signal Off (received from filter 560 at an inverting input of amplifier 570) and in response to the output signal $Out_2$ (received from amplifier 540 at a noninverting input of amplifier 570). For example, amplifier 570 is a differential amplifier for generating a corrected Hall signal (e.g., by subtracting the offset correction signal Off from signal $Out_2$) such that the output signal $Out_{final}$ can be characterized in accordance with $Out_{final} = G_1 S_1 B_{in}(0-f_2) + Off_1$. Accordingly, the low offset, high bandwidth signal $Out_{final}$ is generated, which differs from the high offset, high bandwidth signal $Out_2$ in that, for example, the high offset term $Off_2$ is replaced by the low offset term $Off_1$.

Figure 6:
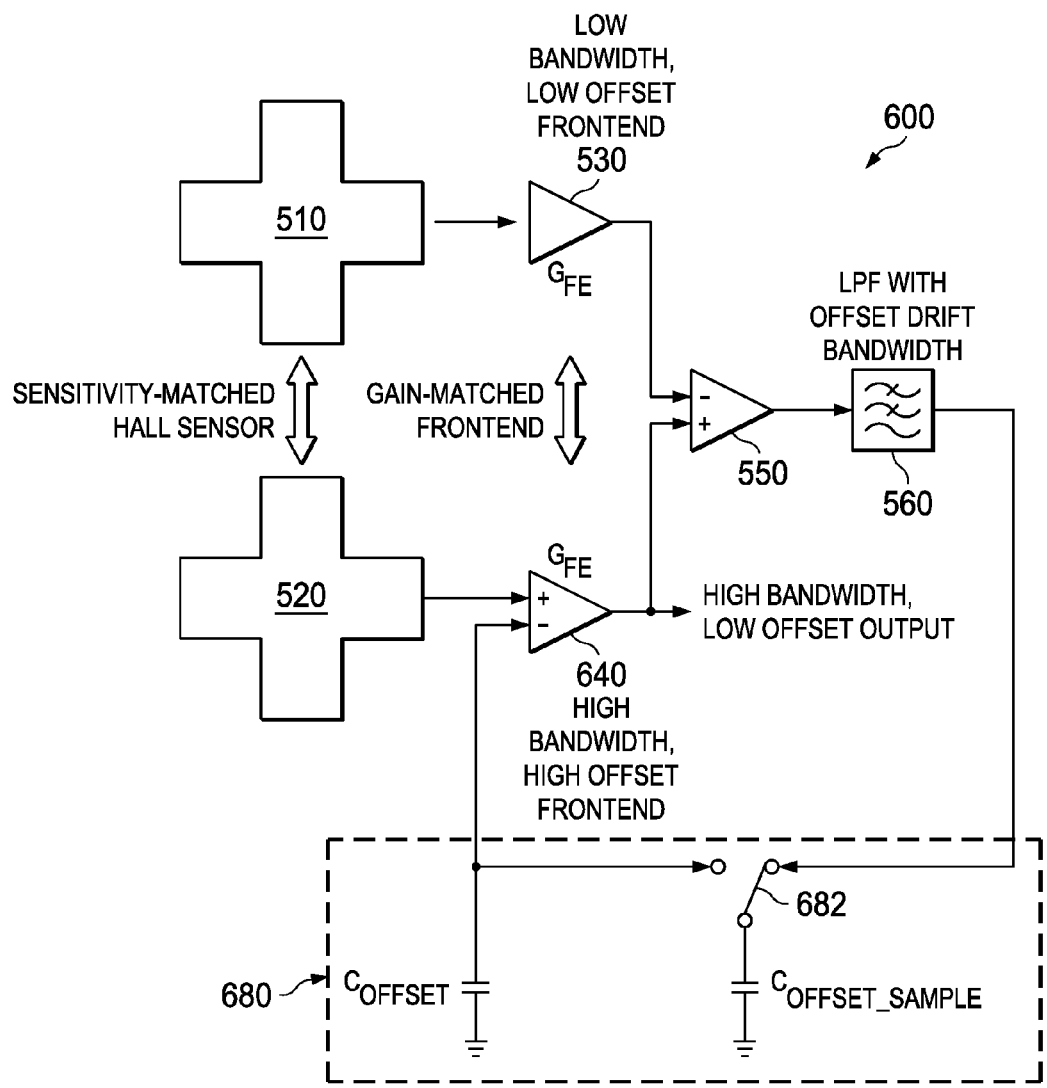
FIG. 6 is a schematic of a schematic of a switched capacitor, high bandwidth Hall-effect circuit 600 including a switched capacitor circuit for offset correction and gain compensation in accordance with embodiments of the disclosure.

FIG. 6 is a schematic of a switched capacitor, high bandwidth Hall-effect circuit 600 including a switched capacitor circuit for offset correction and gain compensation in accordance with embodiments of the disclosure. The high bandwidth Hall-effect circuit 600 includes sensors 510 and 520, amplifiers 530 and 640, differential amplifier 550, filter 560, and differential amplifier 570. The high bandwidth Hall-effect circuit 600 also includes a switched capacitor circuit 680, which includes capacitors $C_{offset}$ and $C_{offset\_sample}$ and switch 682.

The high bandwidth Hall-effect circuit 600 is arranged having a low bandwidth path (which includes components 510, 530, 550, and 560) and a high bandwidth path (which includes components 520 and 640). In a similar manner as discussed above (e.g., with respect to FIG. 5), the relatively high offset of the high bandwidth path is substantially reduced in response to a relatively low offset determined by the low bandwidth path. The relatively high offset of the high bandwidth path is substantially reduced by the switched capacitor circuit 680, which (for example) combines the output of the high bandwidth path with the output of the low bandwidth path to generate a high bandwidth, low offset output.

The switched capacitor circuit includes the switch 682, which operates (for example) under the control of control logic such as CPU 112. The switch operates at a sampling frequency typically selected to greater than the cutoff frequency $f_{lpf}$. For example, the switch 682 samples the offset correction signal Off from filter 560, stores the sample in capacitor $C_{offset\_sample}$, and transfers the sample to the capacitor $C_{offset}$ such that the inverting input of amplifier 640 is biased in accordance with the offset correction signal Off. Additionally, the (e.g., offset tracking ability of the) accumulated charge of capacitor $C_{offset}$ helps to prevent amplifier saturation, which in turn allows higher gain amplifiers to be used as amplifier 640.

Amplifier 640 is an analog front-end amplifier. The input of amplifier 540 is coupled to the output of sensor 520 and the switched capacitor circuit 680 such that amplifier 640 has a gain $G_2$. The gain $G_2$ of the amplifier 640 is selected such that the gain $G_2$ is substantially equal to the gain $G_1$ of amplifier 520. In a similar manner as described for amplifier 540 (which generates the output signal $Out_2$ in accordance with $Out_2=G_1S_1B_{in}(0-f_2)+Off_2$), the amplifier 640 receives the signal Off (which can be characterized in accordance with $Off=Off_2-Off_1$). The amplifier 640 is a differential amplifier for generating a corrected Hall signal (e.g., by subtracting the offset correction signal Off from the high bandwidth, low offset signal received from the sensor 520 similarly to amplifier 570 described above). Accordingly, the output of amplifier 640 is the output signal $Out_{final}$, which can be characterized in accordance with $Out_{final}=G_1S_1B_{in}(0-f_2)+Off_1$. (By inspection, it can be seen in the equation for $Out_{final}$ that the high offset term $Off_2$ has been replaced by the low offset term $Off_1$) In an embodiment, the amplifier 640 can combine selected components of both amplifiers 540 and 570 (as taught with respect to FIG. 5, for example, such that both the amplifiers form a unitary differential amplifier as in amplifier 640).

Figure 7:
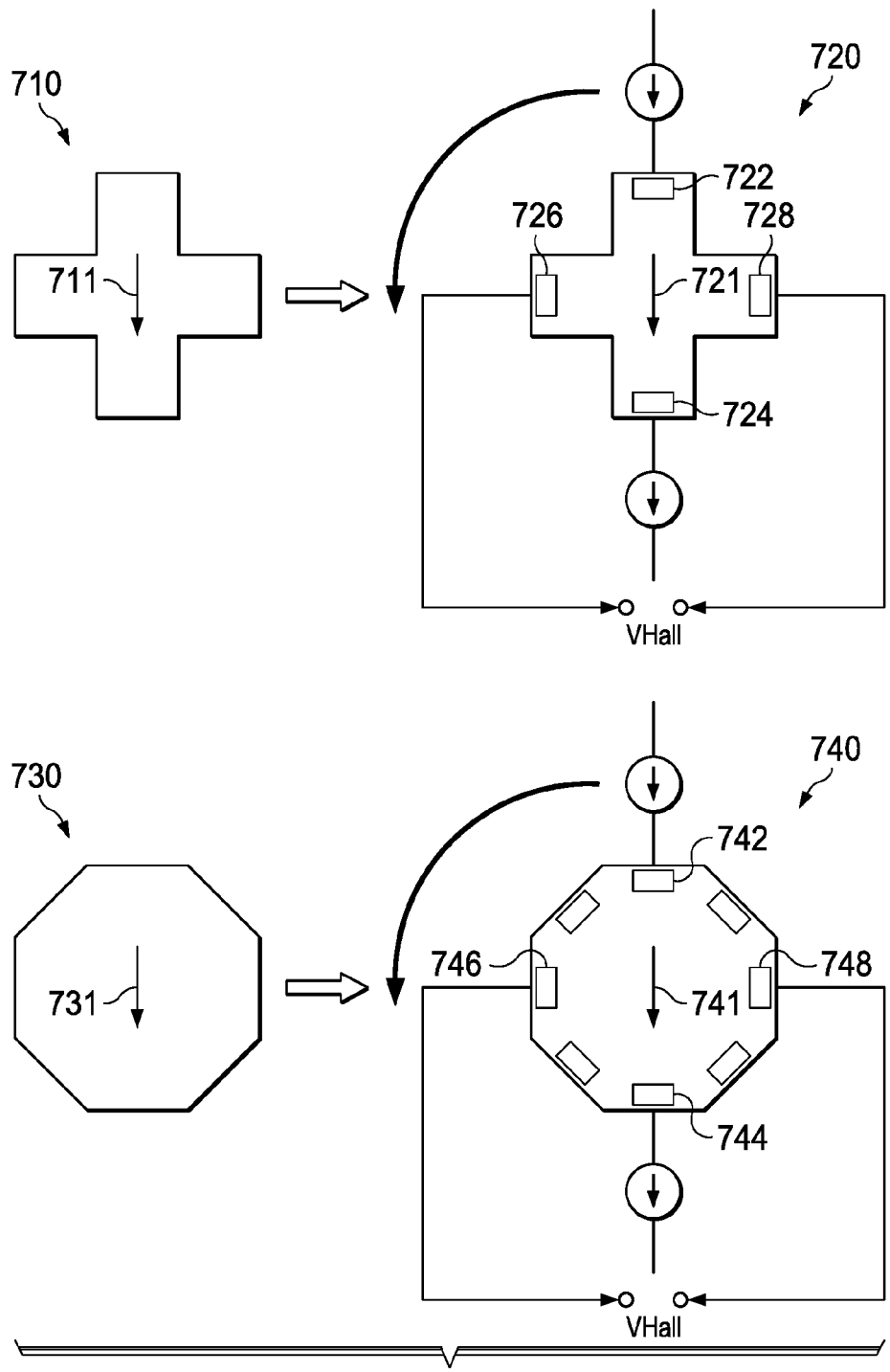
FIG. 7 is a schematic of typical Hall elements for Hall-effect sensors.

FIG. 7 is a schematic of typical Hall elements for Hall-effect sensors. Symbol 710 is a schematic symbol of a Hall element such as a square or a cross. Accordingly, the shape of symbol 710 (and symbol 730, discussed below) is suggestive of a specific Hall type but is not necessarily limited to a specific Hall element type (for example, symbol 710 can also represent an eight-contact element, unless the context of the detailed description clearly teaches otherwise). The current used to bias the Hall element (e.g., that is represented by the symbol 710) is illustrated as current 711. Hall element 720 (which is represented by symbol 710) includes contacts 722, 724, 726, 728. The overall shape of Hall element 720 and the placement of the contacts 722, 724, 726, 728 within the Hall element 720 are illustrated as being generally symmetrical, and arranged during manufacture such that electrical characteristics of the Hall element (e.g., whether operated at 0, 90, 180, and 270 degrees during current spinning) are substantially equal. For example, the impedance presented to the bias current 721 is substantially similar regardless whether the bias current 721 flows from contact 722 to contact 724, from contact 726 to contact 728, from contact 724 to contact 722, or from contact 728 to contact 726.

Symbol 730 is a schematic symbol of a Hall element such having the shape of an octagon (other shapes having an evenly-divisible-by-two number of sides such as a hexadecagon are possible). The current used to bias the Hall element (e.g., that is represented by the symbol 730) is illustrated as current 731. Hall element 740 (which is represented by symbol 730) includes eight contacts such as contact 742, 744, 746, and 748. The overall shape of Hall element 740 and the placement of the contacts within the Hall element 740 are illustrated as being generally symmetrical, and arranged during manufacture such that electrical characteristics of the Hall element (e.g., whether operated at 0, 45, 90, 135, 180, 225, 270, and 315 degrees during current spinning) are substantially equal. A disclosed arrangement of such Hall elements (e.g., Hall elements 720 and 740) in a high bandwidth, low offset Hall-effect sensor is discussed with reference to, at least, FIG. 8 and FIG. 9.

Figure 8:
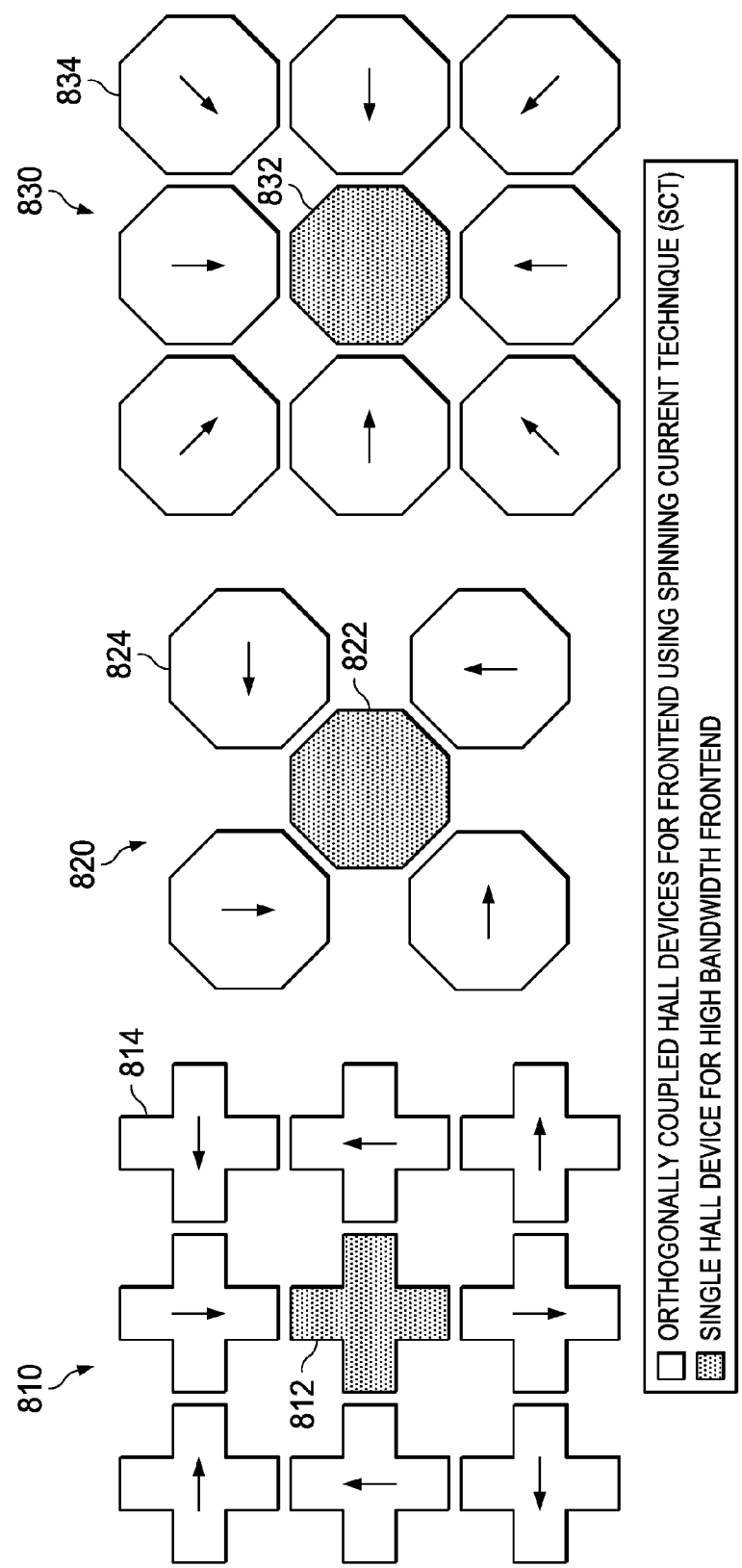
FIG. 8 is a layout diagram of layout patterns for Hall sensor arrays where each pattern includes a single Hall element for coupling to the high bandwidth front end of a high bandwidth, low offset Hall-effect sensor in accordance with embodiments of the present disclosure.

FIG. 8 is a layout diagram of layout patterns for Hall sensor arrays where each pattern includes a central Hall element for coupling to the high bandwidth front end of a high bandwidth, low offset Hall-effect sensor in accordance with embodiments of the present disclosure. Hall sensor array 810 includes a central Hall element 812 (e.g., used for the Hall sensor for a high bandwidth front-end such as Hall sensor 520), which defines a centroid about which the orthogonally coupled Hall elements 814 are arranged. The arrangement of the Hall elements 814 is, for example, substantially symmetrical such that a portion of the central Hall element 812 substantially lies within or intersects an (e.g., notional) area or line defined by the centers of the adjacent Hall elements 814. Accordingly, the central Hall element 812 is substantially centrally located and/or surrounded (including discontinuously surrounded) by the adjacent Hall elements 814 such that the average of the sensitivity of the adjacent Hall elements 814 is substantially similar to the sensitivity of the (e.g., average of one of more of the) central Hall element 812.

The single Hall element 812 and each of the orthogonally coupled Hall elements 814 are typically of similar form (e.g., a symmetrical cross), composition, and function with respect to their own symmetry and with respect to the symmetry of other elements of the Hall sensor array 810. The elements are each placed in a symmetrical arrangement such that, for example, the effects of a magnetic field simultaneously applied to each element of the Hall sensor array 810 is substantially similar to the respective effects upon the other elements of the Hall sensor array (e.g., regardless of whether a particular element is orthogonally coupled with other elements). The orientation (e.g., a particular direction) of the switched (e.g., "spinned") bias currents of the orthogonally coupled Hall elements 814 is illustrated for a single switching phase, such as φ=0.

In operation, the single Hall element 812 generates a high bandwidth Hall-effect voltage in response to a magnetic field. For example, the single Hall element 812 generates a high bandwidth Hall-effect voltage in response to a magnetic field because the single Hall element 812 is not biased using a spinning current technique. In contrast, the adjacent (e.g., peripherally arranged) orthogonally coupled Hall elements 814 are biased using a spinning current technique wherein the bias currents of the orthogonally coupled Hall elements 814 are switched in each of four directions (e.g., such that current flows northward, eastward, southward, and westward). The bias currents of the orthogonally coupled Hall sensors 814 are switched such that the directions of the bias currents have an equal number of currents (e.g., two currents) in each of the directions regardless of the changes in direction of the bias currents in response to the changing of the switching phase.

Hall sensor array 820 includes a single (e.g., central) Hall element 822 (e.g., used for the Hall sensor for a high bandwidth front-end such as Hall sensor 520), which defines a centroid about which the orthogonally coupled Hall elements 824 are arranged. The single Hall element 822 and each of the orthogonally coupled Hall elements 824 are typically of similar form (e.g., an octagon), composition, and function with respect to their own symmetry and with respect to the symmetry of other elements of the Hall sensor array 820. The elements are each placed in a symmetrical arrangement such that, for example, the effects of a magnetic field upon each element of the Hall sensor array 820 is substantially similar to the respective effects upon each of the other elements of the Hall sensor array. The orientation of the switched bias currents of the orthogonally coupled Hall elements 824 is illustrated for a single switching phase, such as φ=0.

In operation, the single Hall element 822 generates a high bandwidth Hall-effect voltage in response to a magnetic field. For example, the single Hall element 822 generates a high bandwidth Hall-effect voltage in response to a magnetic field because the single Hall element 822 is not biased using a spinning current technique. In contrast, the adjacent (e.g., peripherally arranged) orthogonally coupled Hall elements 824 are biased using a spinning current technique wherein the bias currents of the orthogonally coupled Hall elements 824 are switched in each of four directions (e.g., such that current flows northward, eastward, southward, and westward). The bias currents of the orthogonally coupled Hall sensors 824 are switched such that the directions of the bias currents have an equal number of currents (e.g., one current) in each of the directions regardless of the of the changes in direction of the bias currents in response to the changing of the switching phase.

Hall sensor array 830 includes a single (e.g., central) Hall element 832 (e.g., used for the Hall sensor for a high bandwidth front-end such as Hall sensor 520), which defines a centroid about which the orthogonally coupled Hall elements 834 are arranged. The single Hall element 832 and each of the orthogonally coupled Hall elements 834 are typically of similar form (e.g., an octagon), composition, and function with respect to their own symmetry and with respect to the symmetry of other elements of the Hall sensor array 830. The elements are each placed in a symmetrical arrangement such that, for example, the effects of a magnetic field upon each element of the Hall sensor array 830 is substantially similar to the respective effects upon each of the other elements of the Hall sensor array. The orientation of the switched bias currents of the orthogonally coupled Hall elements 834 is illustrated for a single switching phase, such as φ=0.

In operation, the single Hall element 832 generates a high bandwidth Hall-effect voltage in response to a magnetic field. For example, the single Hall element 832 generates a high bandwidth Hall-effect voltage in response to a magnetic field because the single Hall element 832 is not biased using a spinning current technique. In contrast, the adjacent (e.g., peripherally arranged) orthogonally coupled Hall elements 834 are biased using a spinning current technique wherein the bias currents of the orthogonally coupled Hall elements 834 are switched in each of eight directions (e.g., such that current flows northward, northeastward, eastward, southeastward, southward, southwestward, westward, and northwestward). The bias currents of the orthogonally coupled Hall sensors 834 are switched such that the directions of the bias currents have an equal number of currents (e.g., one current) in each of the directions regardless of the of the changes in direction of the bias currents in response to the changing of the switching phase.

Figure 9:
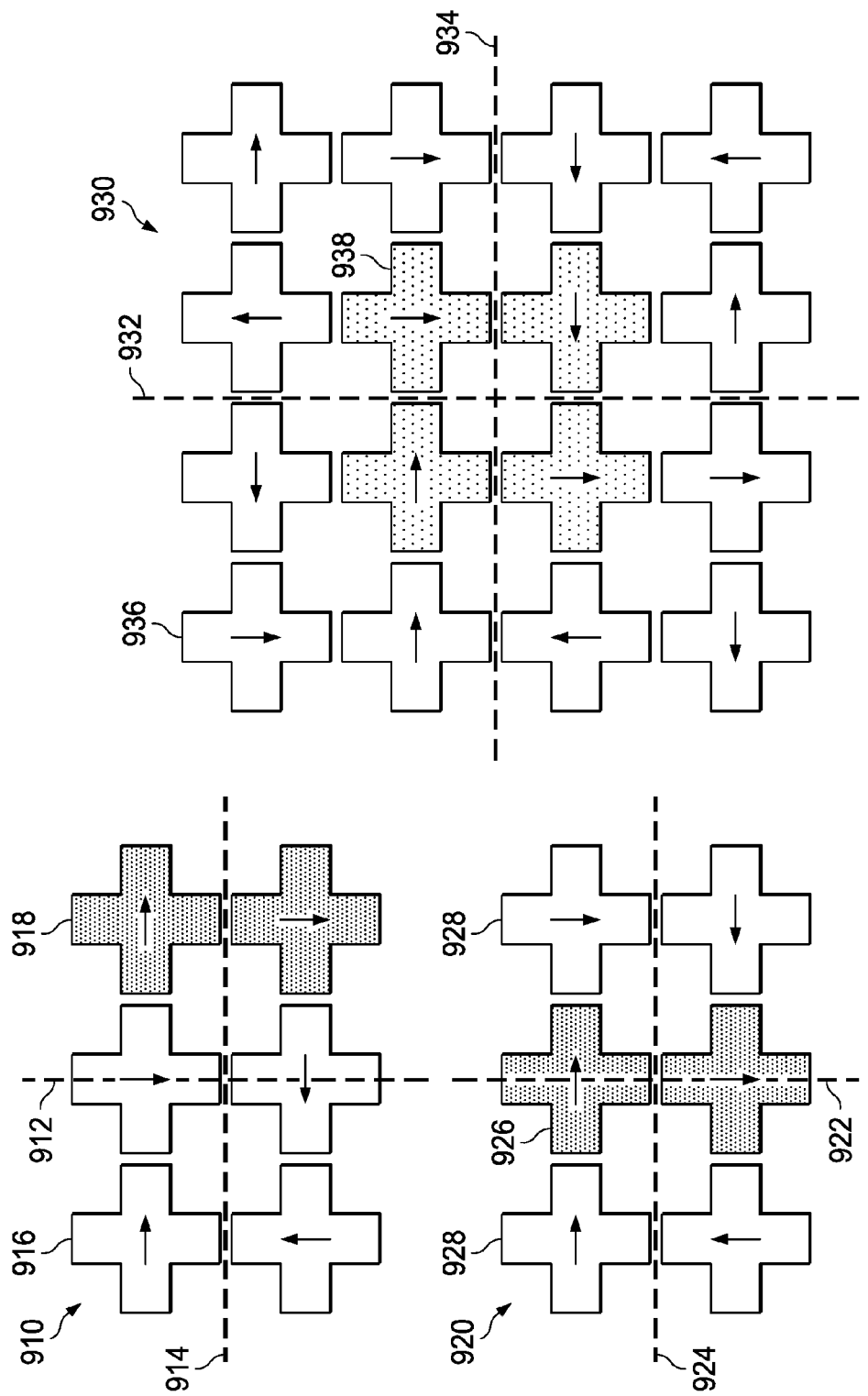
FIG. 9 is a layout diagram of layout patterns for Hall sensor arrays where each pattern includes multiple Hall elements for coupling to the high bandwidth front end of a high bandwidth, low offset Hall-effect sensor in accordance with embodiments of the present disclosure.

FIG. 9 is a layout diagram of layout patterns for Hall sensor arrays where each pattern includes multiple Hall elements for coupling to the high bandwidth front end of a high bandwidth, low offset Hall-effect sensor in accordance with embodiments of the present disclosure. Hall sensor array 910 includes multiple Hall elements 918 (e.g., used for the Hall sensor of a high bandwidth front-end such as Hall sensor 520) and multiple Hall elements 916 (e.g., used for the Hall sensor for a low bandwidth front-end such as Hall sensor 510). The multiple Hall elements 916 are optionally orthogonally coupled (e.g., which reduces offset), whereas the multiple Hall elements 916 are typically both orthogonally coupled and arranged to use spinning current techniques (e.g., which reduces both offset and available bandwidth).

The Hall elements 916 and 918 are symmetrically arranged around either or both a horizontal axis of reflection 914 and a vertical axis of reflection 912, with the Hall elements 916 being adjacently positioned and mutually reflected across the horizontal axis of reflection. For example, a first Hall element 916 is positioned such that the placement first Hall element 916 is reflected by an axis of reflection in the placement such that a corresponding second Hall element 916 appears as a notional mirror image of the first Hall element 916.

The Hall sensor array 910 includes multiple (e.g., two) Hall elements 918 and multiple (e.g., four) Hall elements 916, which are typically of similar form (e.g., a symmetrical cross), composition, and function with respect to their own symmetry and with respect to the symmetry of other elements of the Hall sensor array 910. The elements are each placed in a symmetrical arrangement such that, for example, the effects of a (e.g., applied) magnetic field upon each element of the Hall sensor array 910 is substantially similar to the respective effects upon each of the other elements of the Hall sensor array. The orientation of the switched bias currents of the Hall elements 916 is illustrated using a fixed switching phase, such as φ=0.

In operation, the multiple Hall elements 918 generate a high bandwidth Hall-effect voltage in response to a magnetic field. For example, the multiple Hall elements 918 generate a high bandwidth Hall-effect voltage where the generate Hall-effect voltage has a reduced offset when the multiple Hall elements 918 are orthogonally coupled. In contrast, the adjacent (e.g., symmetrically arranged) orthogonally coupled Hall elements 916 have a further-reduced offset and a reduced available bandwidth as result of being biased using a spinning current technique (wherein the bias currents of the orthogonally coupled Hall elements 916 are switched in each of four directions through four switching phases). The bias currents of the orthogonally coupled Hall sensors 916 are switched such that the directions of the bias currents in a single phase have an equal number of currents (e.g., one current) in each of the directions regardless of the changes in direction of the bias currents in response to the changing of the switching phase.

The Hall sensor array 920 includes multiple Hall elements 926 (e.g., used for the Hall sensor of a high bandwidth front-end such as Hall sensor 520) and multiple Hall elements 928 (e.g., used for the Hall sensor for a low bandwidth front-end such as Hall sensor 510). The multiple Hall elements 926 are optionally orthogonally coupled whereas the multiple Hall elements 928 are typically both orthogonally coupled and arranged to use spinning current techniques.

The Hall elements 926 and 928 are symmetrically arranged around both a horizontal axis of reflection 924 and a vertical axis of reflection 922, with the Hall elements 926 and 928 being adjacently positioned and mutually reflected across each of the horizontal axis of reflection 924 and the vertical axis of reflection 922. For example, a first Hall element 926 is positioned such that the placement first Hall element 926 is reflected by an axis of reflection in the placement such that a corresponding second Hall element 926 appears as a mirror image of the first Hall element 926.

The Hall sensor array 920 includes multiple (e.g., two) Hall elements 926 and multiple (e.g., four) Hall elements 928, which are typically of similar form (e.g., a symmetrical cross), composition, and function with respect to their own symmetry and with respect to the symmetry of other elements of the Hall sensor array 920. The elements are each placed in a symmetrical arrangement such that, for example, the effects of a (e.g., applied) magnetic field upon each element of the Hall sensor array 920 is substantially similar to the respective effects upon each of the other elements of the Hall sensor array. The orientation of the switched bias currents of the orthogonally coupled Hall elements 928 is illustrated for a single switching phase, such as φ=0.

In operation, the multiple Hall elements 926 generate a high bandwidth Hall-effect voltage in response to a magnetic field. For example, the multiple Hall elements 926 generate a high bandwidth Hall-effect voltage where the generate Hall-effect voltage has a reduced offset when the multiple Hall elements 926 are orthogonally coupled. In contrast, the adjacent (e.g., symmetrically arranged) orthogonally coupled Hall elements 928 have a further-reduced offset and a reduced available bandwidth as result of being biased using a spinning current technique. The bias currents of the orthogonally coupled Hall sensors 928 are switched such that the directions of the bias currents in a single phase have an equal number of currents (e.g., one current) in each of the directions regardless of the changes in direction of the bias currents in response to the changing of the switching phase.

The Hall sensor array 930 includes multiple Hall elements 938 (e.g., used for the Hall sensor of a high bandwidth front-end such as Hall sensor 520) and multiple Hall elements 936 (e.g., used for the Hall sensor for a low bandwidth front-end such as Hall sensor 510). The multiple Hall elements 936 and 938 are apportioned in accordance with a ratio of four Hall elements 936 for each Hall element 938. The multiple Hall elements 938 are optionally orthogonally coupled whereas the multiple Hall elements 936 are typically both orthogonally coupled and arranged to use spinning current techniques.

The Hall elements 936 and 938 are symmetrically arranged around both a horizontal axis of reflection 934 and a vertical axis of reflection 932, with the Hall elements 936 and 938 being adjacently positioned and mutually reflected across each of the horizontal axis of reflection 934 and the vertical axis of reflection 932. For example, a first Hall element 936 is positioned such that the placement first Hall element 936 is reflected by an axis of reflection in the placement such that a corresponding second Hall element 936 appears as a mirror image of the first Hall element 936.

The Hall sensor array 930 includes multiple (e.g., four) Hall elements 938 and multiple (e.g., 16) Hall elements 936, which are typically of similar form (e.g., a symmetrical cross), composition, and function with respect to their own symmetry and with respect to the symmetry of other elements of the Hall sensor array 930. The elements are each placed in a symmetrical arrangement such that, for example, the effects of a (e.g., applied) magnetic field upon each element of the Hall sensor array 930 is substantially similar to the respective effects upon each of the other elements of the Hall sensor array. The orientation of the switched bias currents of the orthogonally coupled Hall elements 936 is illustrated for a single switching phase, such as φ=0.

In operation, the multiple Hall elements 938 generate a high bandwidth Hall-effect voltage in response to a magnetic field. For example, the multiple Hall elements 938 generate a high bandwidth Hall-effect voltage where the generate Hall-effect voltage has a reduced offset when the multiple Hall elements 938 are orthogonally coupled. In contrast, the adjacent (e.g., symmetrically arranged) orthogonally coupled Hall elements 936 have a further-reduced offset and a reduced available bandwidth as result of being biased using a spinning current technique. The bias currents of the orthogonally coupled Hall sensors 936 are switched such that the directions of the bias currents in a single phase have an equal number of currents (e.g., four currents) in each of the directions regardless of the direction of the bias currents.

Figure 10:
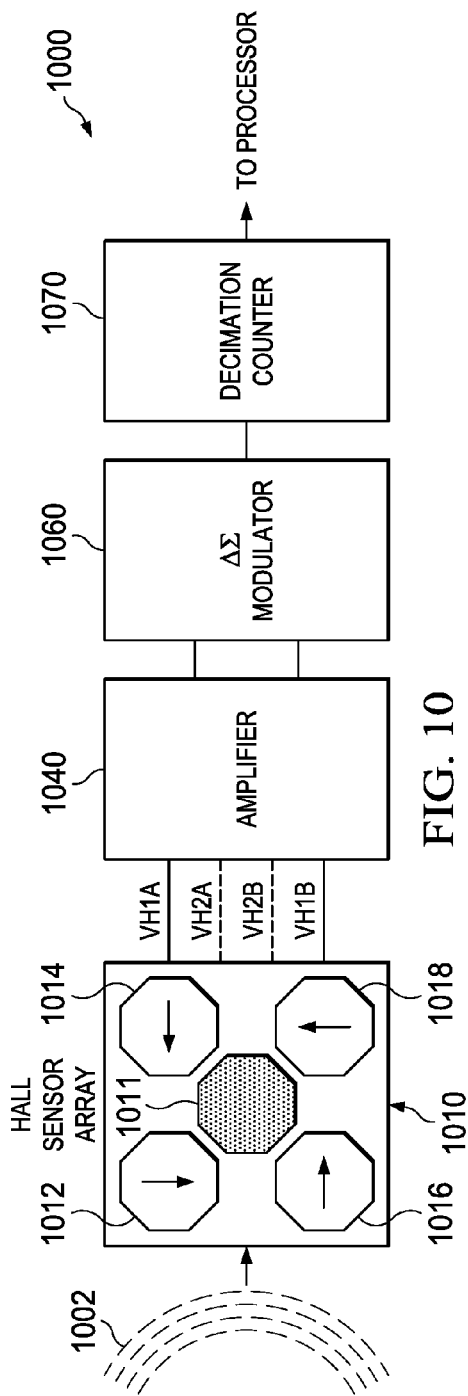
FIG. 10 is a block diagram of a Hall-effect sensor having a digital output in accordance with embodiments of the present disclosure.

FIG. 10 is a block diagram of a Hall-effect sensor having a digital output in accordance with embodiments of the present disclosure. Hall-effect sensor 1000 includes Hall sensor array 1010, amplifier 1040, delta-sigma (ΔΣ) modulator 1060, and decimation counter 1070. The Hall-effect sensor 1010 detects (e.g., including quantifying) disturbances in magnetic field 1002 and to generate a signal for indicating the detected disturbances (e.g., generated by moving magnets, objects moving within a magnetic field, and the like).

The Hall-effect sensor 1000 is selected to operate in accordance with an operating mode. For example, a first operating mode is a low-bandwidth-derived offset-reduction signal mode (such as described with respect to the operation of Hall-effect circuit 500). The low-bandwidth-derived offset-reduction signal mode can be selected (for example) by activating circuitry to separately (e.g., high- from low-bandwidth) process outputs of Hall elements.

Additionally, a second operating mode is a transimpedance mode (such as described below with respect to the operation of Hall-effect circuit 1310 and 1320). The low-bandwidth-derived offset-reduction signal mode can be selected (for example) by activating switches to selectively couple feedback components, where the frequency response can be selected by setting a feedback resistance (by selectively coupling one or more feedback resistors) and by setting a feedback capacitance (by selectively coupling one or more feedback capacitors). The low-bandwidth-derived offset-reduction signal mode and the transimpedance mode can be used singly or in combination to reduce offset of Hall elements.

The signal generated by the Hall-effect sensor 1010 is coupled to a processor (e.g., CPU 112) for taking an action in response to the signal generated by the Hall-effect sensor 1010. The action can include activating a user-interface "button," (e.g., in response to a user pointing at a displayed menu option), providing visual and/or aural feedback, adjusting engine control parameters in response to a degree of rotation of a rotating shaft, and the like.

Hall sensor array 1010 includes Hall elements such as (e.g., low bandwidth) Hall elements 1012, 1014, 1016, and 1018. The Hall elements 1012, 1014, 1016, and 1018 can be orthogonally coupled and have spinning current techniques applied to reduce the offset of the Hall elements 1012, 1014, 1016, and 1018. In response to the (e.g., disturbances in the) magnetic field 1002, the Hall sensor array 1010 outputs Hall voltage signals VH1A and VH1B.

The Hall element 1011 generates (e.g., high bandwidth) bandwidth reference Hall voltage signals VH2A and VH2B. As described above with reference to FIG. 5 and FIG. 6 (for example), the Hall voltage signals VH2A and VH2B are processed by the amplifier 1040 (in the low-bandwidth-derived offset-reduction signal mode) to reduce to offset of the Hall voltage signals VH1A and VH1B.

In the transimpedance mode, the amplifier 1040 includes a transimpedance amplifier circuit (e.g., instead of a conventional voltage amplifier) to extract more bandwidth from a given combination of Hall elements. Accordingly, the transimpedance amplifier circuit of the amplifier 1040 can be a circuit such as model 1320, discussed below.

The delta-sigma modulator 1060 receives the output of the amplifier 1040 and converts the received output to a bit stream by performing (for example) first order delta-sigma modulation. The decimation counter 1070 is (for example) an up-down counter for receiving the bit stream from the delta-sigma modulator 1060 and for decimating the received bit stream for output as a signal for further processing by a processor (such as CPU 112, as described above). In various embodiments, the delta-sigma modulator 1060 can be replace by various kinds of ADCs (analog-to-digital converters). Further, analog-based systems can use an analog output signal such that an ADC can be bypassed and/or not used.

Figure 11:
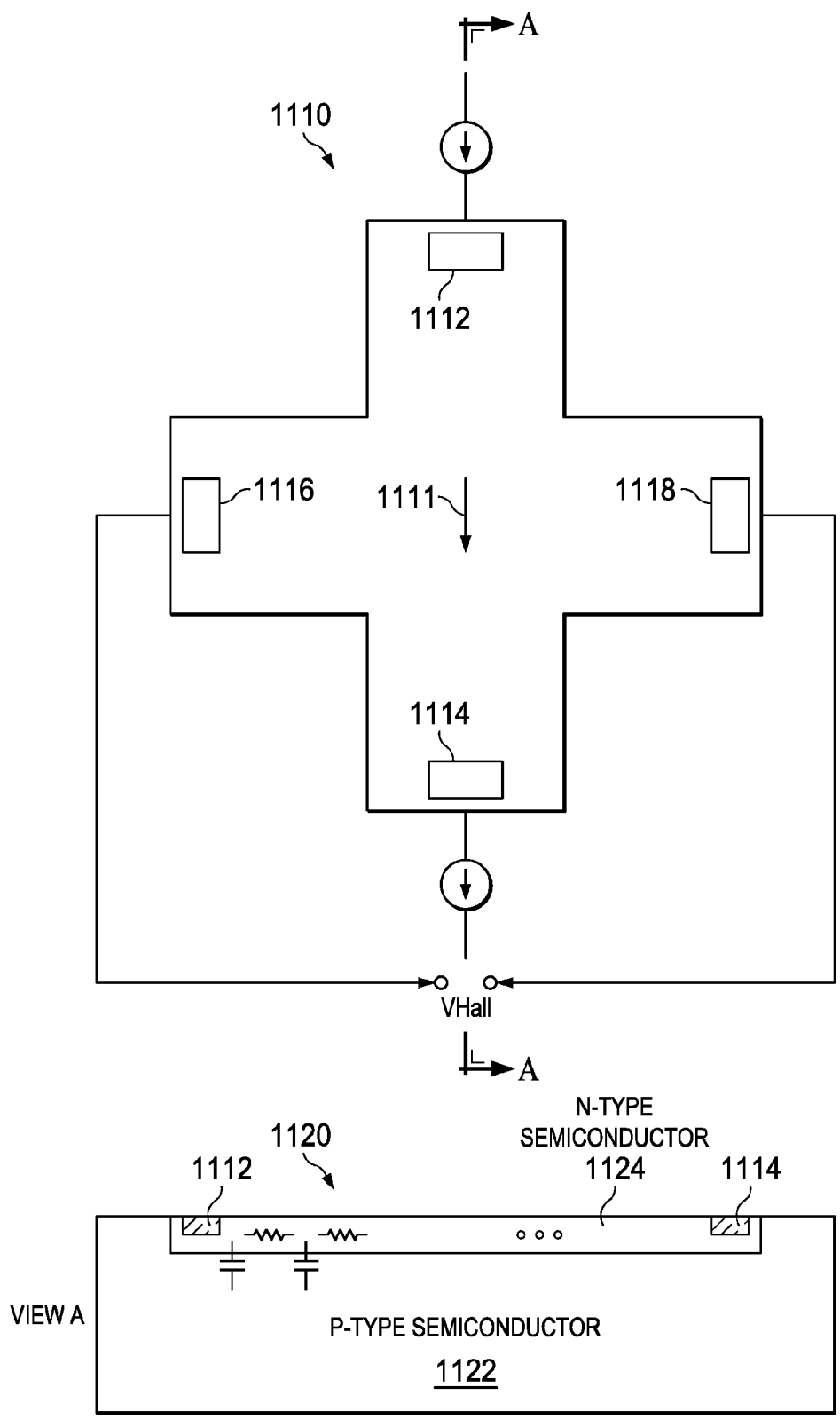
FIG. 11 is a layout diagram of a Hall-effect sensor.

FIG. 11 is a layout diagram of a Hall-effect sensor. Hall element 1110 is a cross-shaped (e.g., Van der Paw structure) Hall element and is illustrated in plan view. Hall element 1110 includes contacts 1112, 1114, 1116, and 1118. A bias current 1111 is carried from contact 1112 to contact 1114 such that a Hall voltage (VHall) is generated (e.g., in the presence of a magnetic field) with respect to the contacts within 1116 and 1118.

Hall element 1120 is illustrated as a cross-section (View A) along section A of Hall element 1110. The Hall element 1120 is formed in P-type substrate 1122 in which an N-well 1124 is formed. The contacts 1112 and 1114 are formed in N-well 1124 through which the bias current 1111 flows. The conduction channel in the N-well 1124 in which the bias current 1111 flows in accordance with an impedance, which in turn can be modeled in accordance with transmission line (e.g., which includes parasitic elements in series such as resistors and elements in parallel such as capacitors) theory. Accordingly, the intrinsic bandwidth of Hall sensors (such as those including structures such as Hall element 1120) is limited by the distributed RC (resistance and capacitance) impedance where the channel resistance is denoted by R and the junction (e.g., the PN junction formed between the in P-type substrate 1122 in which an N-well 1124) capacitance is denoted by C.

Figure 12:
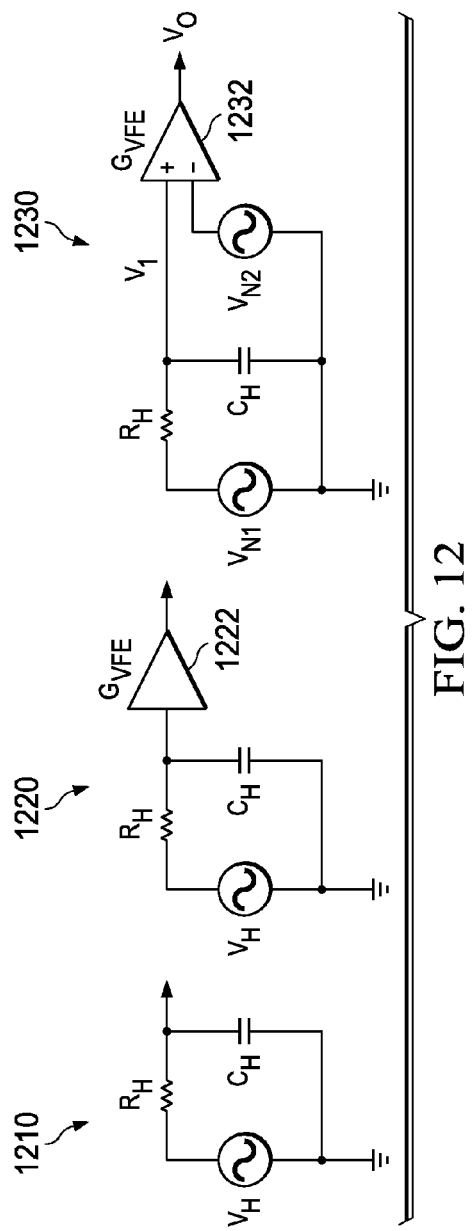
FIG. 12 is a schematic diagram of models of Hall sensors.

FIG. 12 is a schematic diagram of models of Hall sensors. Model 1210 is a schematic of a Hall element including voltage source $V_H$ (e.g., where the voltage of the voltage source $V_H$ is induced by a magnetic field in accordance with a Hall effect). The Hall voltage $V_H$ is impeded by the series resistance $R_H$ of the conductance channel and the parallel capacitance $C_H$ of the PN junction of the Hall element.

As design rules for new manufacturing technologies allow Hall elements having increasingly small areas, the sensitivity of Hall elements (e.g., that have the same shape and/or aspect ratio) with smaller areas ideally remains similar to the larger elements. For example, when die sizes are "shrunk" (e.g., made smaller in both horizontal and vertical directions), the impedance $R_H$ generally remains the same while the impedance $C_H$ typically decreases. Distributed sheet resistance (resistance/unit square) and sheet capacitance (capacitance/unit square) remains same as die sizes are made smaller such that the overall resistance remains the same in accordance with the geometry (aspect ratio) of the device remaining the same. However, the total capacitance reduces as device area decreases. As disclosed herein, the Hall sensor bandwidth of conventional Hall sensors is effectively limited by the RC-based parasitic elements when coupled to conventional voltage sensing frontend amplifiers.

Model 1220 is a schematic of a Hall element coupled to a voltage sensing amplifier frontend. The model 1220 includes voltage-sensing amplifier 1222, which has a gain function of $G_{VFE}$ (frontend gain of voltage sensing amplifier). The bandwidth of the Hall sensor frontend can be expressed as:

$$\text{Bandwidth } f_{3dB} = \frac{1}{2\pi R_H C_H} \quad (3)$$

Accordingly, the bandwidth $f_{3dB}$ increases as the size of (e.g., a fixed aspect ratio) Hall element decreases.

Model 1230 is a schematic of a noise model of a Hall element coupled to a voltage sensing amplifier frontend. The model 1230 includes a differential voltage sensing amplifier 1232, which includes a non-inverting input coupled to a first noise source $V_{n1}$ (e.g., for modeling the noise of the Hall-effect sensor), and which includes an inverting input coupled to a second noise source Vie (e.g., for modeling the input voltage noise of the amplifier). The model 1230 has a gain function of $G_{VFE}$. The total noise referred to the Hall sensor frontend input can be expressed as:

$$\sigma_{n,tot} = \sigma_{n1} \oplus \sigma_{n2} \quad (4)$$

such that $$\sigma_{n,tot} = \sqrt{4kTR_H} \oplus \sigma_{n2} \quad (5)$$

where $\sigma_{n,tot}$ is the noise total, k is Boltzmann's constant, T is the noise temperature, $\sigma_{n1}$ is a noise source associated with a first output (e.g., positive terminal) of a Hall element, the $\oplus$ operator is the square root of the sum of the squares operator, and $\sigma_{n2}$ is a noise source associated with a second output (e.g., ground terminal) of a Hall element.

In accordance with the present disclosure, the bandwidth of Hall sensors can be increased using a current-sensing amplifier frontend.

Figure 13:
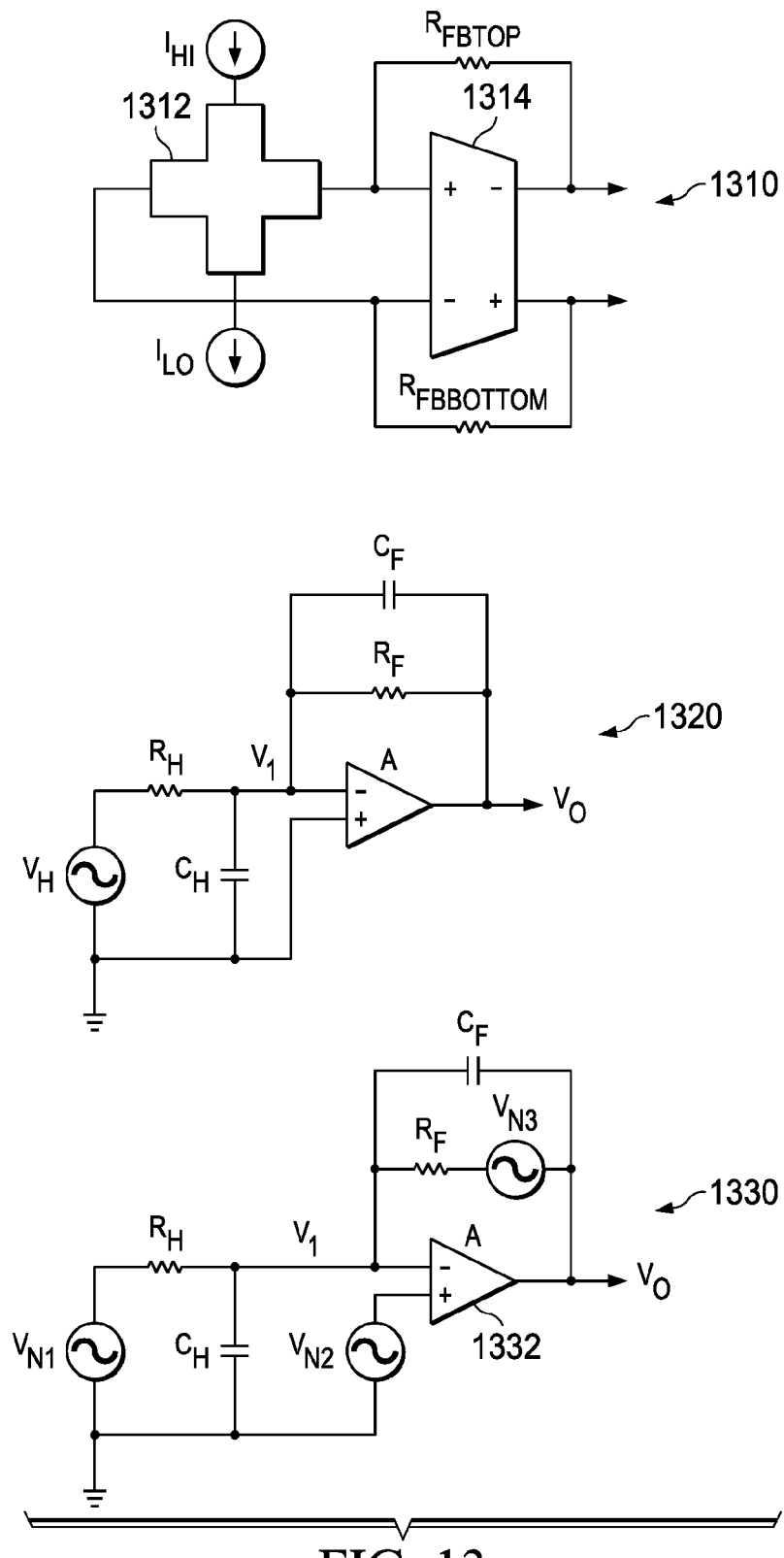
FIG. 13 is a schematic diagram of models of current sensing amplifier coupled to a Hall element in accordance with embodiments of the present disclosure.

FIG. 13 is a schematic diagram of models of current sensing amplifier coupled to a Hall element in accordance with embodiments of the present disclosure. Model 1310 is a schematic of a current-sensing amplifier 1314 coupled to a Hall sensor 1312. As disclosed herein, the operating bandwidth of Hall sensors can be increased by coupling a Hall sensor to a current-sensing amplifier frontend (e.g., amplifier 1020). The Hall sensor 1312 produces a Hall-signal output current across east and west terminals in response to a bias current (e.g., source) $I_{HI}$ coupled to the north terminal of the Hall sensor 1312 and a bias current (e.g., sink) $I_{LO}$ coupled to the south terminal of the Hall sensor 1312. The Hall sensor 1312 can be a Hall element array upon which spin current techniques are optionally used to reduce the offset of the one or more Hall elements of the Hall sensor 1312. When more than one Hall element is used as Hall sensor 1312, the plurality of such elements are typically orthogonally coupled.

The current-sensing amplifier 1314 includes a non-inverting input coupled to the east terminal (of a first polarity) of the Hall element 1312 and to a first terminal of a "top" feedback resistor $R_{FBTOP}$ (where the "top" feedback resistor $R_{FBTOP}$ illustrates impedances such as resistance and capacitance). The second terminal of the feedback resistor $R_{FBTOP}$ is coupled to the non-inverting output of the current sensing amplifier 1314 such that a top feedback current is generated in response to the Hall-effect voltage generated at the west terminal.

In a similar (but having opposing polarities, for example) manner, the sensing amplifier 1314 includes an inverting input coupled to the west terminal (of a polarity inverse to the first polarity) of the Hall element 1312 and to a first terminal of a "bottom" feedback resistor $R_{FBBOTTOM}$ (where the "bottom" feedback resistor $R_{FBBOTTOM}$ illustrates impedances such as resistance and capacitance). The second terminal of the feedback resistor $R_{FBBOTTOM}$ is coupled to the non-inverting output of the current sensing amplifier 1314 such that a bottom feedback current is generated in response to the Hall-effect voltage generated at the east terminal. The top feedback current is applied (e.g., coupled) to a first opposing Hall terminal (e.g., the west terminal, and the bottom feedback current is applied to a second opposing Hall terminal (e.g., the east terminal), such that the Hall-effect voltage is amplified by the current sensing amplifier 1314.

Accordingly, the current sensing amplifier 1314 generates a differential output (e.g., voltage) in response to voltages developed in response to the applied Hall-effect voltage (e.g., where opposing terminals of a Hall element respectively source and sink the current) and in response to the current limited by each feedback resistor. The differential voltage developed at each of the inputs of the current sensing amplifier 1314 is respectively amplified by the current sensing amplifier 1314 in accordance with principles of negative feedback.

Model 1320 is a (e.g., theoretically) equivalent circuit of the model 1310 (e.g., such that model 1320 is a simplified embodiment of the current sensing amplifier 1314 coupled to the Hall sensor 1312 described above). The model 1320 includes the Hall sensor modeling devices $V_H$, $R_H$, and $C_H$ and a voltage amplifier A, to which the feedback capacitor $C_F$ and feedback resistor $R_F$ are coupled.

In operation, the generated Hall voltage $V_H$ (e.g., which models the output of a Hall sensor) is developed by a Hall-signal output current where the Hall-output current is impeded by the series resistance $R_H$ of the conductance channel and the parallel capacitance $C_H$ of the PN junction of the Hall element such that a (e.g., low-pass filtered) voltage is applied to the node $V_1$. The node $V_1$ is coupled to the inverting input of amplifier A of model 1320 (which is a high impedance input, such that the impedance of the input does not directly affect the voltage level of the node $V_1$. The output of the model 1320 amplifier A generates a feedback current in accordance with the feedback capacitor $C_F$ and feedback resistor $R_F$, both of which are coupled in parallel between the output of the model 1320 amplifier A and the inverting input of the model 1320 amplifier A. The feedback current is opposite in direction (e.g., polarity) from the direction of the Hall-signal output current. Accordingly, the output $V_O$ of the model 1320 amplifier A is regulated in accordance with the values of the feedback capacitor $C_F$ and feedback resistor $R_F$ and the voltage (e.g., otherwise) developed in response to the Hall-signal input at the inverting input is suppressed.

The operation of the model 1320 amplifier A is typical of a transimpedance amplifier where $V_1$ is held at the virtual ground and, accordingly, the Hall-signal output is conveyed as a current, such that the Hall-signal is (e.g., instead) converted to voltage across $R_F$. For example, the voltage $V_1$ developed at the first (e.g., inverting) input is limited to a voltage associated with a voltage developed at the second (e.g., non-inverting) input of the model 1320 amplifier A. Because $V_1$ is held at a virtual ground by the feedback current counterpoising (e.g., having an opposing and balancing effect upon the Hall-signal output current), the effect of $C_H$ is minimized (e.g., by suppressing the voltage that otherwise would be developed but for the counterpoising feedback current).

As disclosed herein, the operating bandwidth of the (e.g., amplified) Hall voltage $V_H$ is controlled (e.g., limited) by the values (e.g., chosen by a designer) of the feedback capacitor $C_F$ and feedback resistor $R_F$. Accordingly, the operating bandwidth of the Hall voltage $V_H$ no longer need be limited by the strengths of the parasitic elements (e.g., $R_H$ and $C_H$) of the Hall sensor.

The operation of model 1320 can be described in accordance with the following. The gain function of $G_{FE}$ (frontend gain of current sensing amplifier) can be expressed as:

$$G_{FE}(s) = -\frac{A}{A+1}\frac{R_F}{R_H}\frac{1}{\left[\frac{R_F}{R_H}\frac{(1+sR_HC_H)}{1+A}+(1+sR_FC_F)\right]} \quad (6)$$

where s is the complex number frequency parameter associated with Laplace transform and A is the open-loop gain of the amplifier.

Eq. (6), when simplified (e.g., to provide a result substantially similar to a result calculated in accordance with Eq. (6)), demonstrates a $G_{FE}(s)$ of approximately:

$$G_{FE}(s) \approx -\frac{R_F}{R_H}\frac{1}{1+sR_FC_F} \quad (7)$$

Accordingly, the operating bandwidth of the Hall sensor frontend can be expressed as:

$$\text{Bandwidth } f_{3dB} = \frac{1}{2\pi R_F C_F} \quad (8)$$

It can be seen by inspection of Eq. (8) that the operating bandwidth is a function of the feedback components $R_F$ and $C_F$ (e.g., which can be components selected by a designer during design or selected during operation as described below with reference to FIG. 16). In contrast, conventional solutions have bandwidths in accordance with Eq. (3), in which the bandwidth is a function of $R_H$ and $C_H$ (e.g., which are parasitic components of a Hall element that designers cannot eliminate and/or fully control during design).

Model 1330 is a schematic of a noise model of a Hall element coupled to a current sensing amplifier frontend. The model 1330 includes a differential voltage amplifier 1332. The differential voltage amplifier 1332 includes a non-inverting input coupled to a first noise source $V_{n1}$ (e.g., for modeling the noise of the Hall-effect sensor), an inverting input coupled to a second noise source $V_{n2}$ (e.g., for modeling the input referred voltage noise of the amplifier), and an inverting input coupled to a third noise source $V_{n3}$ (e.g., for modeling the thermal noise of the feedback resistor). The model 1330 has a gain function of $G_{FE}$. The noise referred to the Hall sensor frontend can be expressed as:

$$\sigma_{n,tot} = \sigma_{n1} \oplus \sigma_{n2} \oplus \frac{\sigma_{n3}}{(R_F/R_H)} \quad (9)$$

such that $$\sigma_{n,tot} = \sqrt{4kTR_H} \oplus \sigma_{n2} \oplus R_H\sqrt{4kT/R_F} \quad (10)$$

where $\sigma_{n,tot}$ is the noise total, k is Boltzmann's constant, T is the noise temperature, $\sigma_{n1}$ is a noise source associated with a first output (e.g., positive terminal) of a Hall element, $\sigma_{n2}$ is a noise source associated with input referred noise of the amplifier, and element, $\sigma_{n3}$ is a noise source associated with the thermal noise of the feedback resistor. Accordingly, Eq. (10) demonstrates the noise tradeoff of the instant current sensing scheme (as compared with Eq. (5), for example, which demonstrates the noise tradeoff of a voltage-sensing scheme).

Figure 14:
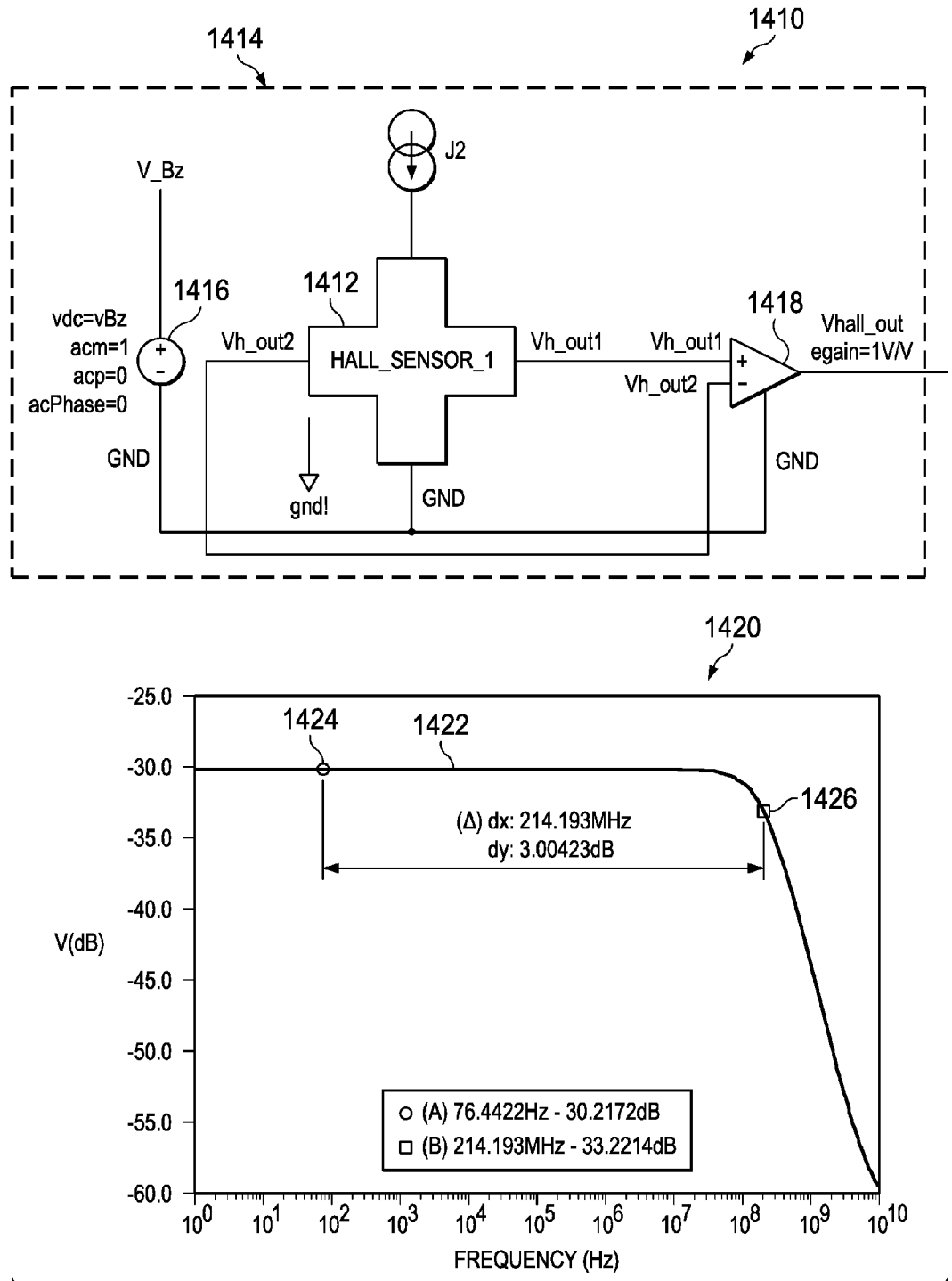
FIG. 14 is a simulation diagram of a Hall sensor coupled to an ideal voltage amplifier.

FIG. 14 is a simulation diagram of a Hall sensor coupled to an ideal voltage amplifier. Model 1410 is a schematic for simulating selected characteristics of Hall sensor 1412 such that an output of the Hall sensor 1412 is coupled to an input of the ideal voltage amplifier 1418. Model 1410 includes a substrate 1414, which is biased with a DC voltage provided by voltage source 1416 and is coupled to a ground (e.g., signal "gnd!"). The Hall sensor 1412 is arranged (e.g., virtually) in the substrate 1414 and generates a Hall voltage across east (Vh_out1) and west terminals (Vh_out2) in response to a Hall sensor bias current generated by current source J2. The Hall sensor bias current is sourced via the north terminal of the Hall sensor 1412 and is sunk (e.g., shunted to ground) via the south terminal of the Hall sensor 1412. For purposes of, for example, comparison of simulation results of the disclosed model 1500 described below, the Hall sensor 1412 is a Hall element array upon which spin current techniques are not used to reduce the offset of the one or more Hall elements of the Hall sensor 1412.

An (e.g., positive Hall-effect) output of the Hall sensor 1412 is coupled to an input of the unity gain voltage sense amplifier 1418. The amplifier is a unity gain voltage sense amplifier having a gain function such as described above in Eq. (3). In contrast with the disclosed transimpedance amplifier 1518, the unity gain voltage sense amplifier 1418 does not include a feedback path, and is bandwidth-limited in accordance with the source impedance (e.g., parasitic resistance and capacitance) of the Hall sensor 1412.

Frequency response diagram 1420 includes a response curve 1422, which illustrates voltage in decibels (dB) as a function of frequency (e.g., using logarithmic scaling). The response curve 1422 includes points 1424 and 1426, which illustrate a bandwidth demonstrated by a simulation of model 1410. For example, point 1424 illustrates a lower frequency point having a magnitude of around −30 dB at a frequency of around 76 Hz. Point 1426 illustrates a higher frequency point having a magnitude of around −33 dB at a frequency of around 214 MHz. A bandwidth of around 214 MHz over a 3 dB decline in gain is demonstrated during simulation.

Figure 15:
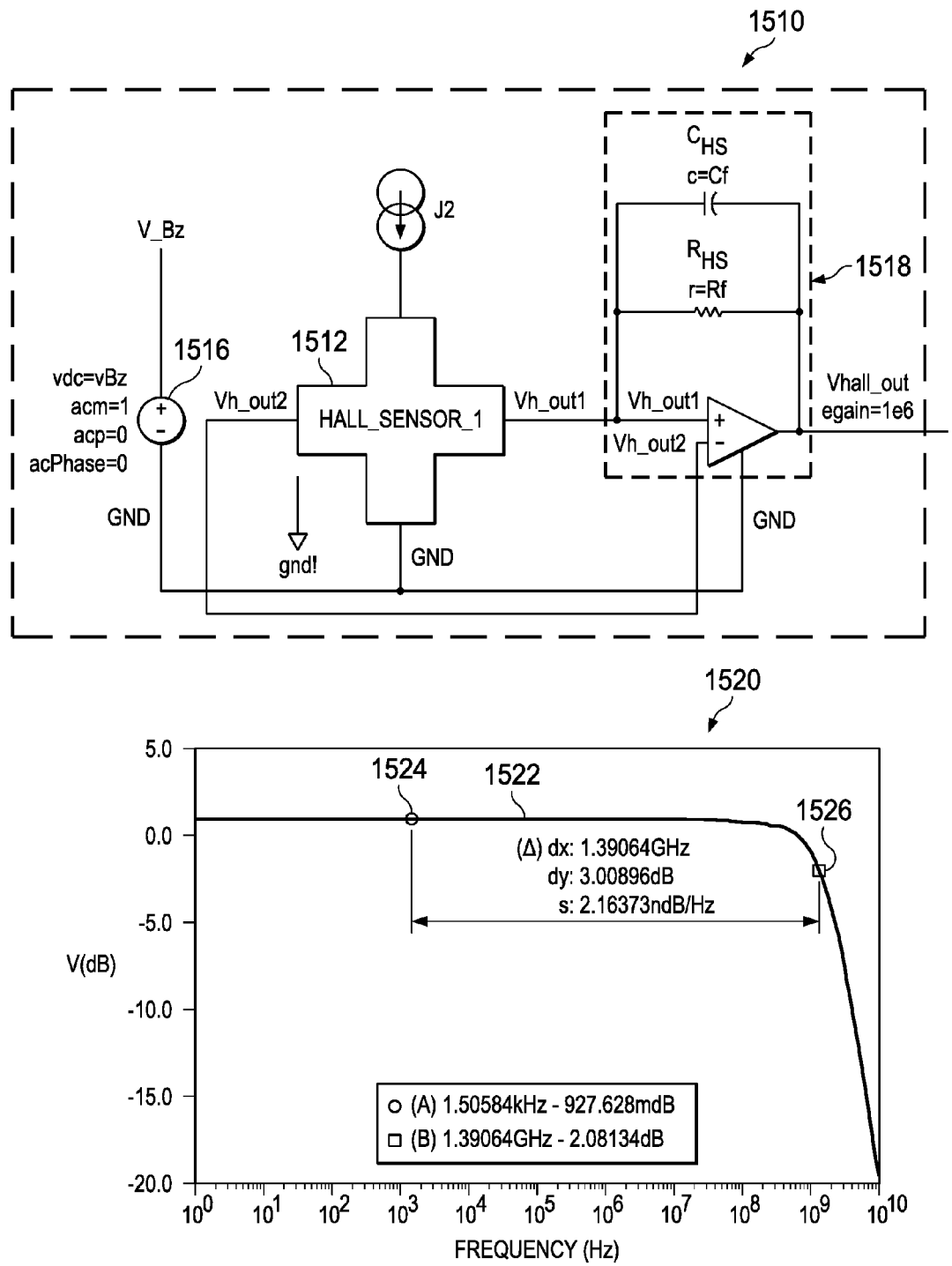
FIG. 15 is a simulation diagram of a Hall sensor coupled to a transimpedance amplifier in accordance with embodiments of the disclosure.

FIG. 15 is a simulation diagram of a Hall sensor coupled to a transimpedance amplifier in accordance with embodiments of the disclosure. Model 1510 is a schematic for simulating selected characteristics of Hall sensor 1512 such that an output of the Hall sensor 1512 is coupled to an input of a transimpedance amplifier 1518. The input magnetic field is modeled by voltage source 1516 and the Hall sensor 1512 and generates a Hall voltage across east (Vh_out1) and west terminals (Vh_out2) in response to a Hall sensor bias current generated by current source J2 and magnetic field input 1516. The Hall sensor bias current is sourced via the north terminal of the Hall sensor 1512 and is sunk (e.g., shunted to ground) via the south terminal of the Hall sensor 1512. For purposes of, for example, comparison of simulation results of the model 1400, the Hall sensor 1512 is a Hall element array upon which spin current techniques are not used to reduce the offset of the one or more Hall elements of the Hall sensor 1512.

An (e.g., positive Hall-effect) output of the Hall sensor 1512 is coupled to an input of the transimpedance amplifier 1518. The transimpedance amplifier is a transimpedance amplifier having a gain function such as described above in Eq. (6) and Eq. (7), an input bandwidth a gain function such as described in Eq. (8), and a noise model such as described in Eq. (9) and Eq. (10). In an embodiment, the transimpedance amplifier 1518 includes a feedback path, which includes feedback components such as capacitor $C_f$ and resistor $R_f$ of model 1510. As discussed above, the bandwidth of the (e.g., amplified) Hall voltage $V_H$ is controlled by the values selected for the (e.g., non-parasitic) feedback capacitor $C_f$ and the (e.g., non-parasitic) feedback resistor $R_f$.

The frequency response diagram 1520 includes a response curve 1522, which illustrates voltage in decibels (dB) as a function of frequency (e.g., using logarithmic scaling). The response curve 1522 includes points 1524 and 1526, which illustrate an operating bandwidth demonstrated by a simulation of model 1510. For example, point 1524 illustrates a lower frequency point having a magnitude of around 1 dB at a frequency of around 1.5 kHz. Point 1526 illustrates a higher frequency point having a magnitude of around −2 dB at a frequency of around 1.39 GHz. In an embodiment, an operating bandwidth of around 1.39 GHz over a 3 dB decline in gain is demonstrated during simulation.

The model 1510 and model 1610 (discussed below) are transimpedance amplifiers and, as disclosed herein, can be used in place of amplifier 530 and/or 540 such that (for example) the corrected offset signal (derived in response to outputs of amplifiers 530 and 540) is more accurate. The corrected offset signal is more accurate (e.g., than the corrected offset signal derived only from the teachings of FIG. 5) because the offset correction techniques (e.g., of FIG. 5 and FIG. 6) and the transimpedance amplifiers (e.g., of FIG. 15 and FIG. 16) are used together.

Figure 16:
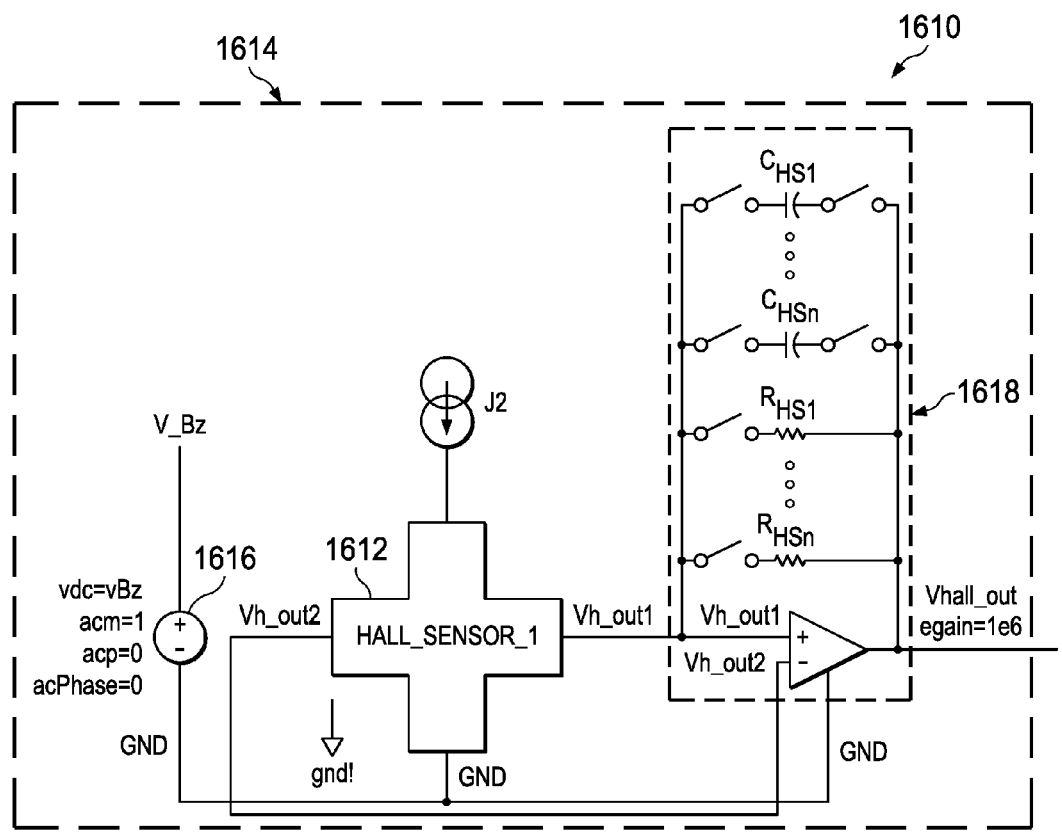
FIG. 16 is a simulation diagram of a Hall sensor coupled to a variable transimpedance amplifier in accordance with embodiments of the disclosure.

FIG. 16 is a simulation diagram of a Hall sensor coupled to a variable transimpedance amplifier in accordance with embodiments of the disclosure. Model 1610 is a schematic for simulating selected characteristics of Hall sensor 1612 such that an output of the Hall sensor 1612 is coupled to an input of a transimpedance amplifier 1618. Model 1610 includes a Hall sensor 1612, a substrate 1614, a voltage source 1616, and a transimpedance amplifier 1618. The Hall-effect voltage of the Hall sensor 1612 is coupled to an input of the transimpedance amplifier 1618.

In an embodiment, the transimpedance amplifier 1618 includes a variable impedance feedback path, which includes feedback components such as capacitor $C_f$ and resistor $R_f$ of model 1610. As discussed above, the bandwidth of the (e.g., amplified) Hall voltage $V_H$ is selectively controlled by the values selected for the (e.g., non-parasitic) feedback capacitor $C_f$ and the (e.g., non-parasitic) feedback resistor $R_f$. The values can be programmably selected, for example, during operation and/or calibration (e.g., under control of a processor such as CPU 112 executing special-purpose instructions) by iteratively closing switches for selectively coupling (and decoupling) the feedback components and measuring responses for a given feedback impedance such that an optimum feedback impedance is selected. The calibration routine can be run intermittently during operation such that optimum feedback impedance is selected in view of changes in operating conditions (such as changes in temperature). The optimum feedback impedance can accordingly be selected to maximize an operating bandwidth of the transimpedance amplifiers 1618.

Figure 17:
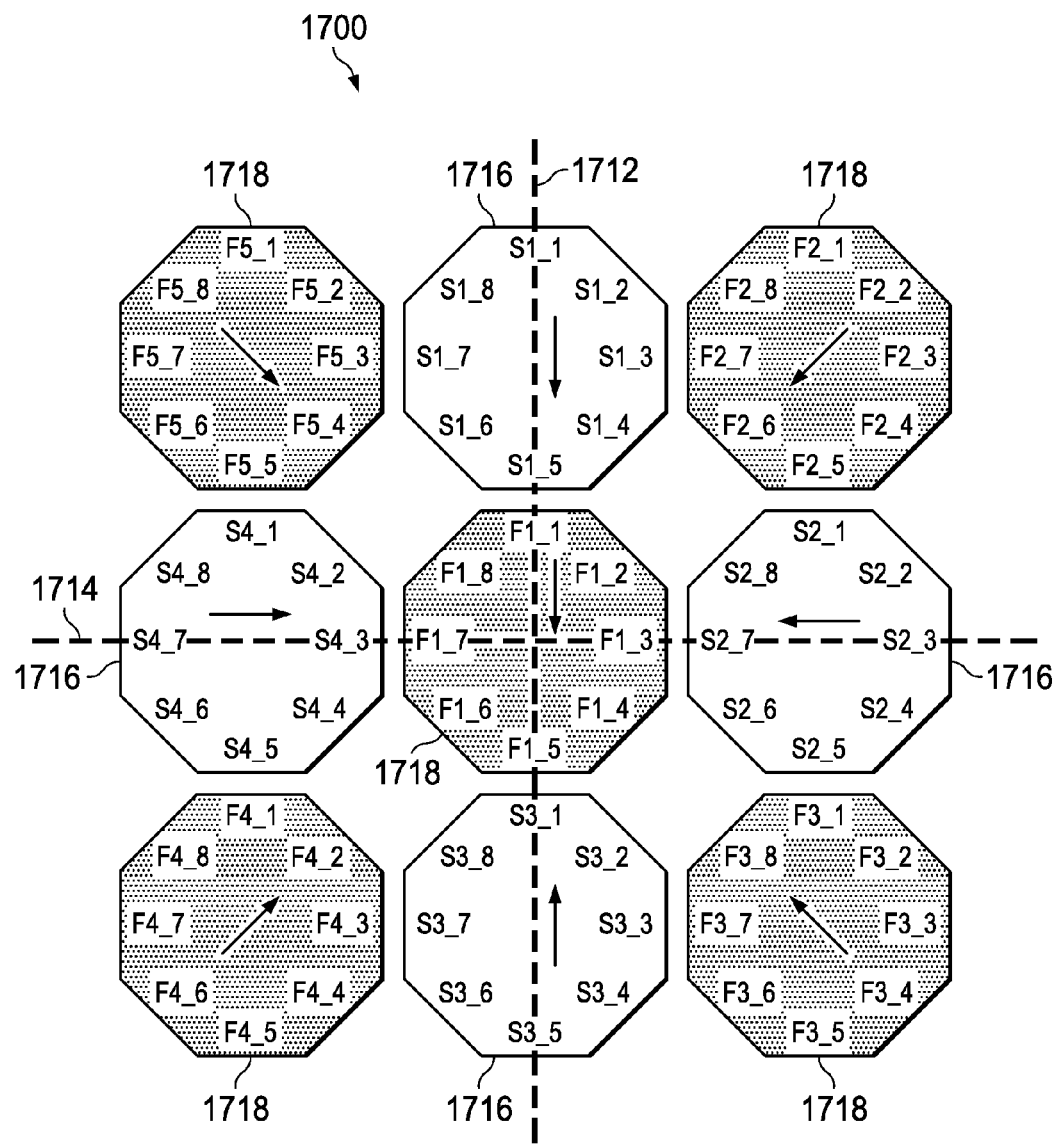
FIG. 17 is another layout diagram of layout patterns for Hall sensor arrays where each pattern includes multiple Hall elements for coupling to the high bandwidth front end of a high bandwidth, low offset Hall-effect sensor in accordance with embodiments of the present.

FIG. 17 is a layout diagram of layout patterns for Hall sensor arrays where each pattern includes multiple Hall elements for coupling to the high bandwidth front end of a high bandwidth, low offset Hall-effect sensor in accordance with embodiments of the present disclosure. Hall sensor array 1710 includes multiple Hall elements 1718 (e.g., used for the Hall sensor of a high bandwidth front-end such as Hall sensor 520) and multiple Hall elements 1716 (e.g., used for the Hall sensor for a low bandwidth front-end such as Hall sensor 510). The multiple Hall elements 1716 are optionally orthogonally coupled (e.g., which reduces offset), whereas the multiple Hall elements 1716 are typically both orthogonally coupled and arranged to use spinning current techniques (e.g., which reduces both offset and available bandwidth). As illustrated, the multiple Hall elements 1716 include elements S1 through S4 (with each element having positions 1 through 8), while the Hall elements 1718 include element F1 through F5 (with each element having positions 1 through 8).

The Hall elements 1716 and 1718 are symmetrically arranged around either or both a horizontal axis of reflection 1714 and a vertical axis of reflection 1712, with the Hall elements 1716 being adjacently positioned and mutually reflected across the horizontal axis of reflection. For example, a first Hall element 1716 is positioned such that the placement first Hall element 1716 is reflected by an axis of reflection in the placement such that a corresponding second Hall element 1716 appears as a notional mirror image of the first Hall element 1716.

The Hall sensor array 1710 includes multiple (e.g., five) Hall elements 1718 and multiple (e.g., four) Hall elements 1716, which are typically of similar form (e.g., a symmetrical cross), composition, and function with respect to their own symmetry and with respect to the symmetry of other elements of the Hall sensor array 1710. The elements are each placed in a symmetrical arrangement such that, for example, the effects of a (e.g., applied) magnetic field upon each element of the Hall sensor array 1710 is substantially similar to the respective effects upon each of the other elements of the Hall sensor array. The orientation of the switched bias currents of the Hall elements 1716 is illustrated using a fixed switching phase, such as φ=0.

In operation, the multiple Hall elements 1718 generate a high bandwidth Hall-effect voltage in response to a magnetic field. For example, the multiple Hall elements generate a high bandwidth Hall-effect voltage where the generate Hall-effect voltage has a reduced offset when the multiple Hall elements 1718 are orthogonally coupled. In contrast, the adjacent (e.g., symmetrically arranged) orthogonally coupled Hall elements 1716 have a further-reduced offset and a reduced available bandwidth as result of being biased using a spinning current technique (wherein the bias currents of the orthogonally coupled Hall elements 1716 are switched in each of eight directions through eight switching phases). The bias currents of the orthogonally coupled Hall sensors 1716 are switched such that the directions of the bias currents in a single phase have an equal number of currents (e.g., one current) in each of the directions regardless of the changes in direction of the bias currents in response to the changing of the switching phase. For example, at switching phase φ=0, a first low-bandwidth, orthogonally coupled Hall element 1716 is biased from position (e.g., terminal) S1_1 to position S1_5 (from N to S), a second low-bandwidth, orthogonally coupled Hall element 1716 is biased from position S2_3 to position S2_7 (from E to W), a third low-bandwidth, orthogonally coupled Hall element 1716 is biased from position S3_5 to position S3_1 (from S to N), and a fourth low-bandwidth, orthogonally coupled Hall element 1716 is biased from position S4_7 to position S4_3 (from W to E).

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit, comprising:
    a first amplifier for generating a first amplified signal in response to a first Hall sensor signal received from a first Hall-effect sensor;
    a second amplifier for generating a second amplified signal in response to a second Hall sensor signal received from a second Hall-effect sensor;
    a third amplifier for generating a subtracted output signal in response to a difference between the first amplified signal and the second amplified signal;
    a filter for generating an offset correction signal in response to the subtracted output signal; and
    a fourth amplifier for generating a corrected Hall signal in response to the offset correction signal and in response to the second amplified signal.

2. The circuit of claim 1, wherein the first Hall sensor signal is generated in response to an applied magnetic field applied to the first Hall-effect sensor, and the second Hall sensor signal is generated in response to the applied magnetic field applied to the second Hall-effect sensor.

3. The circuit of claim 1, wherein the first Hall-effect sensor is operable to generate the first Hall sensor signal such that the first Hall sensor signal includes a residual offset lower than a residual offset of the second Hall sensor signal.

4. The circuit of claim 3, wherein the third amplifier is operable to generate the subtracted output signal such that the subtracted output signal includes a residual offset lower than the residual offset of the second Hall sensor signal.

5. The circuit of claim 4, wherein the second Hall-effect sensor is operable to generate the second Hall sensor signal such that the bandwidth of the second Hall sensor signal is higher than the bandwidth of the first Hall sensor signal.

6. The circuit of claim 5, wherein the third amplifier is operable to generate the subtracted output signal such that the bandwidth of the subtracted output signal is higher than the bandwidth of the first Hall sensor signal.

7. The circuit of claim 1, wherein the filter is a low pass filter.

8. The circuit of claim 1, wherein at least one of first and second amplifiers is a transimpedance amplifier.

9. The circuit of claim 8, wherein the transimpedance amplifier (TA) includes an output and an input, wherein a resistor $R_F$ formed as a discrete component and a capacitor $C_F$ formed as a discrete component are coupled in parallel between the TA output and a TA input.

10. A circuit, comprising:
    a first amplifier for generating a high-frequency portion output signal in response to a difference between a first Hall output signal and a second Hall output signal, wherein the second Hall output signal includes higher frequencies than the frequencies included by the first Hall output signal;
    a filter for reducing high-frequency content of the high-frequency portion output signal and generating an offset correction signal; and
    a second amplifier for generating a corrected Hall signal in response to a difference between the second Hall output signal and the offset correction signal.

11. The circuit of claim 10, wherein the second Hall output signal includes a higher residual offset than the residual offset included by the first Hall output signal.

12. The circuit of claim 11, wherein the corrected Hall signal includes a lower residual offset than the residual offset included by the second Hall output signal.

13. The circuit of claim 10, wherein the second amplifier is a transimpedance amplifier (TA), wherein a resistor $R_F$ formed as a discrete component and a capacitor $C_F$ formed as a discrete component are coupled in parallel between an output of the second amplifier and the input of the second amplifier to which the second Hall output signal is coupled.

14. A system, comprising:
a first Hall-effect sensor for generating a first Hall sensor signal in response to an applied magnetic field;
a second Hall-effect sensor for generating a second Hall sensor signal in response to the applied magnetic field;
a first amplifier for generating a first amplified signal in response to the first Hall sensor signal;
a second amplifier for generating a second amplified signal in response to the second Hall sensor signal;
a third amplifier for generating a subtracted output signal in response to the first amplified signal and the second amplified signal;
a filter for generating an offset correction signal in response to the subtracted output signal; and
a fourth amplifier for generating a corrected Hall signal in response to the offset correction signal and in response to the second amplified signal.

15. The system of claim 14, wherein the first Hall sensor signal is generated in response to a spinning current technique (SCT) applied to a Hall element of the first Hall-effect sensor.

16. The system of claim 14, wherein the first Hall-effect sensor includes Hall elements, wherein each of the Hall elements is mutually orthogonally coupled.

17. The system of claim 16, wherein a portion of an element of the second Hall-effect sensor lies within or intersects an area or line defined by centers of at least some of the elements the first Hall sensor.

18. A method, comprising:
generating a first amplified signal in response to a first Hall sensor signal received from a first Hall-effect sensor;
generating a second amplified signal in response to a second Hall sensor signal received from a second Hall-effect sensor;
generating a subtracted output signal in response to the first amplified signal and the second amplified signal, wherein the subtracted output signal includes high frequency information generated in response to a magnetic field applied to the second Hall-effect sensor;
generating an offset correction signal in response to the subtracted output signal; and
generating a corrected Hall signal in response to the offset correction signal and in response to the second amplified signal.

19. The method of claim 18, comprising sampling the offset correction signal, holding the sampled offset correction signal, and subtracting the held offset correction signal from the second amplified signal.

* * * * *